United States Patent
Hu et al.

(10) Patent No.: US 10,552,955 B2
(45) Date of Patent: Feb. 4, 2020

(54) IMAGING ACCELERATION METHODS FOR MRI PARAMETER MAPPING

(71) Applicant: YALE UNIVERSITY, New Haven, CT (US)

(72) Inventors: Chenxi Hu, New Haven, CT (US); Dana Peters, New London, CT (US)

(73) Assignee: Yale University, New Haven, CT (US)

(*) Notice: Subject to any disclaimer, the term of this patent is extended or adjusted under 35 U.S.C. 154(b) by 128 days.

(21) Appl. No.: 15/945,301

(22) Filed: Apr. 4, 2018

(65) Prior Publication Data

US 2018/0286041 A1  Oct. 4, 2018

Related U.S. Application Data

(60) Provisional application No. 62/481,361, filed on Apr. 4, 2017.

(51) Int. Cl.
*G06K 9/00* (2006.01)
*G01V 3/00* (2006.01)
*G06T 7/00* (2017.01)
*G06T 11/00* (2006.01)
*G06T 15/08* (2011.01)

(52) U.S. Cl.
CPC .......... *G06T 7/0012* (2013.01); *G06T 11/005* (2013.01); *G06T 11/006* (2013.01); *G06T 11/008* (2013.01); *G06T 15/08* (2013.01); *G06T 2207/30008* (2013.01); *G06T 2207/30016* (2013.01); *G06T 2207/30048* (2013.01); *G06T 2207/30056* (2013.01);
(Continued)

(58) Field of Classification Search
USPC ....... 382/100, 103, 107, 128–134, 154, 162, 382/168, 173, 181, 199, 219, 224, 254, 382/274, 276, 285, 291, 305; 324/307, 324/306; 600/410; 378/4, 21
See application file for complete search history.

(56) References Cited

U.S. PATENT DOCUMENTS

| | | | | |
|---|---|---|---|---|
| 5,363,042 A | * | 11/1994 | Dumoulin | G01R 33/50 324/306 |
| 5,387,866 A | | 2/1995 | Dumoulin | |

(Continued)

OTHER PUBLICATIONS

Bano, et al.,On the accuracy and precision of cardiac magnetic resonance T2 mapping: A high-resolution radial study using adiabatic T2 preparation at 3 T., Magn Reson Med. 77(1), 2017,159-169.

(Continued)

*Primary Examiner* — Seyed H Azarian
(74) *Attorney, Agent, or Firm* — Saul Ewing Arnstein & Lehr LLP; Kathryn Doyle; Domingos J. Silva

(57) ABSTRACT

The present invention provides novel methods of accurately and efficiently reconstructing parameter maps in MRI data. In certain embodiments, the methods have reduced data acquisition time or improved spatial resolution when compared to methods standard in the art. In other embodiments, the methods have reduced acquisition and reconstruction time when compared to other acceleration methods in the art in parametric mapping. In other embodiments, the methods are less susceptible to influence of eddy currents when compared to other acceleration methods in the art in parametric mapping.

19 Claims, 32 Drawing Sheets

(52) U.S. Cl.
CPC ............... *G06T 2207/30068* (2013.01); *G06T 2207/30081* (2013.01); *G06T 2207/30084* (2013.01)

(56) References Cited

U.S. PATENT DOCUMENTS

| | | | | |
|---|---|---|---|---|
| 6,487,435 | B2* | 11/2002 | Mistretta | G01R 33/4824 324/307 |
| 6,803,762 | B2 | 10/2004 | Shah et al. | |
| 8,077,955 | B2 | 12/2011 | Dannels et al. | |
| 8,581,583 | B2 | 11/2013 | Greiser | |
| 2003/0042904 | A1 | 3/2003 | Wiese et al. | |
| 2003/0057946 | A1 | 3/2003 | Shah et al. | |
| 2005/0174113 | A1* | 8/2005 | Tsao | G01R 33/5611 324/307 |
| 2008/0292167 | A1* | 11/2008 | Todd | G01R 33/4804 382/131 |
| 2015/0276909 | A1 | 10/2015 | Kawaji et al. | |
| 2015/0287222 | A1* | 10/2015 | Zhao | G01R 33/50 382/131 |
| 2016/0071291 | A1* | 3/2016 | Samsonov | A61B 5/055 600/410 |

OTHER PUBLICATIONS

Block, et al.,Model-based iterative reconstruction for radial fast spin-echo MRI, IEEE Trans Med Imaging. 28 (11) ,2009 ,1759-1769.

Breuer, et al.,Controlled aliasing in parallel imaging results in higher acceleration (CAIPIRINHA) for multi-slice imaging, Magn Reson Med. 53(3) ,2005 ,684-691.

Breuer, et al.,Controlled aliasing in volumetric parallel imaging (2D CAIPIRINHA), . Magn Reson Med. 55 (3) ,2006 ,549-556.

Doneva, et al.,Compressed sensing reconstruction for magnetic resonance parameter mapping, Magn Reson Med. 64(4) , 2010 ,1114-1120.

Giri et al.,T2 quantification for improved detection of myocardial edema., J Cardiovasc Magn Reson. 11 ,2009 ,56.

Griswold, et al.,Generalized autocalibrating partially parallel acquisitions (GRAPPA), Magn Reson Med. 47 (6) ,2002 ,1202-1210.

Henkelman, et al.,Why fat is bright in RARE and fast spin-echo imaging, J Magn Reson Imaging. 1992;2 (5) ,1992 ,533-540.

Hu, et al.,Trust Region Methods for the Estimation of a Complex Exponential Decay Model in MRI With a Single-Shot or Multi-Shot Trajectory, IEEE Transactions on Image Processing. 24(11) , 2015 ,3694-3706.

Ma, et al.,Magnetic resonance fingerprinting, Nature. 495 (7440) ,2013 ,187-192.

Madore, et al.,Unaliasing by fourier-encoding the overlaps using the temporal dimension (UNFOLD), applied to cardiac imaging and fMRI, Magn Reson Med. 42(5) ,1999 ,813-828.

Messroghli, et al.,Modified Look-Locker inversion recovery (MOLLI) for high-resolution T1 mapping of the heart, Magn Reson Med. 52(1) ,2004 ,141-146.

Pierre, et al.,Multiscale reconstruction for MR fingerprinting, Magn Reson Med. 75(6) ,2016 ,2481-2492.

Pruessmann, et al.,SENSE: sensitivity encoding for fast MRI., Magn Reson Med. 42(5) ,1999 ,952-962.

Setsompop, et al.,Blipped-controlled aliasing in parallel imaging for simultaneous multislice echo planar imaging with reduced g-factor penalty, Magn Reson Med. 67(5) ,2012 ,1210-1224.

Tsao, et al.,k-t BLAST and k-t SENSE: dynamic MRI with high frame rate exploiting spatiotemporal correlations, Magn Reson Med. 50(5) ,2003 ,1031-1042.

Velikina, et al.,Accelerating MR parameter mapping using sparsity-promoting regularization in parametric dimension, Magn Reson Med. 70(5) ,2013 ,1263-1273.

* cited by examiner

FIG. 1D
Sampling: lines #1, #5...  Sampling: lines #3, #7...
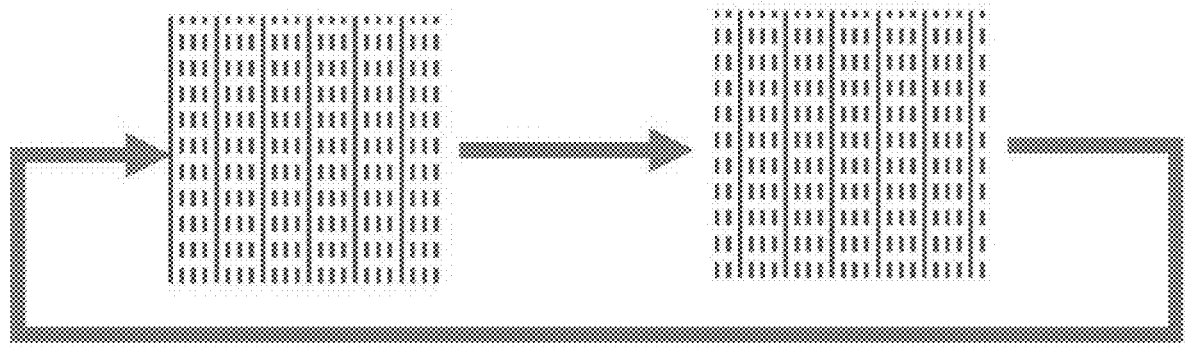
FIG. 2A
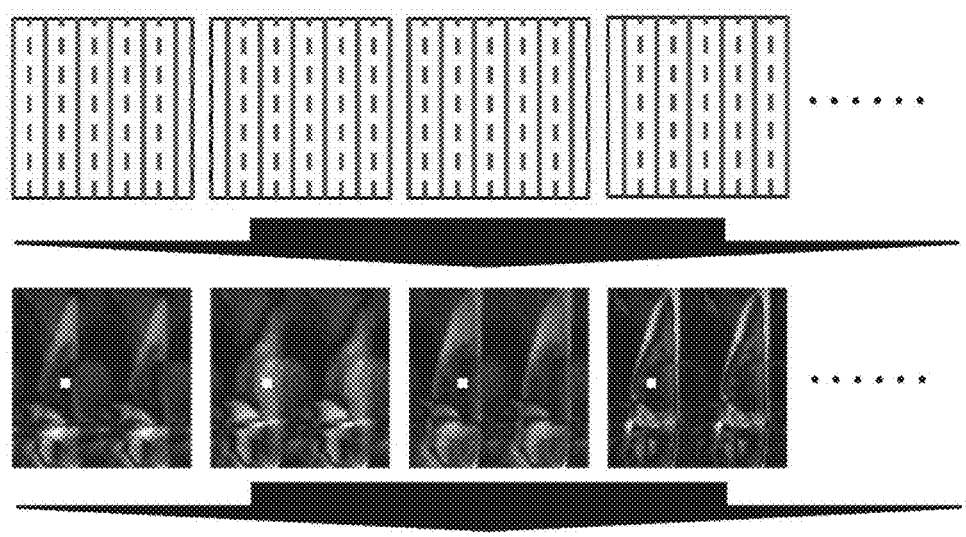
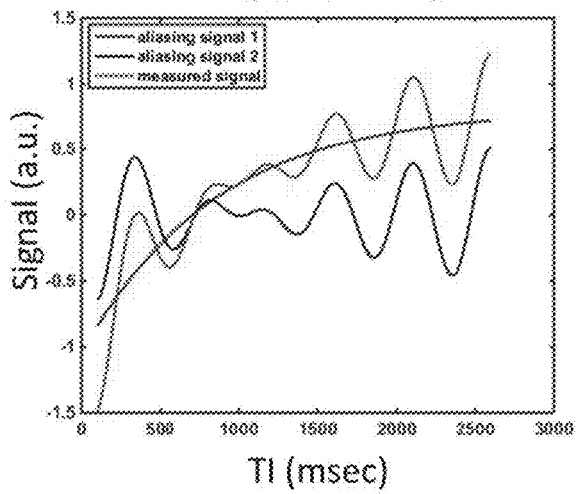
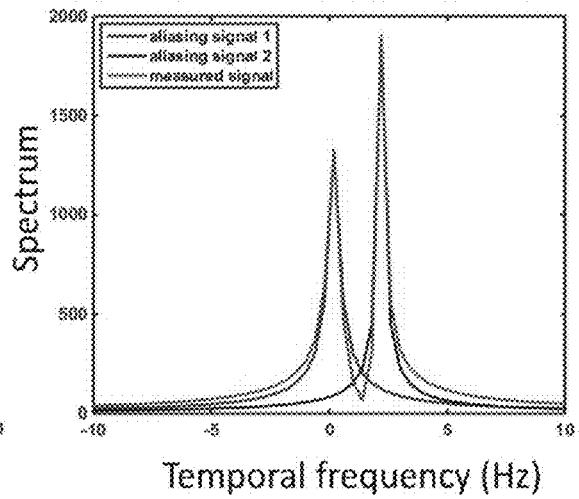

FIG. 2B
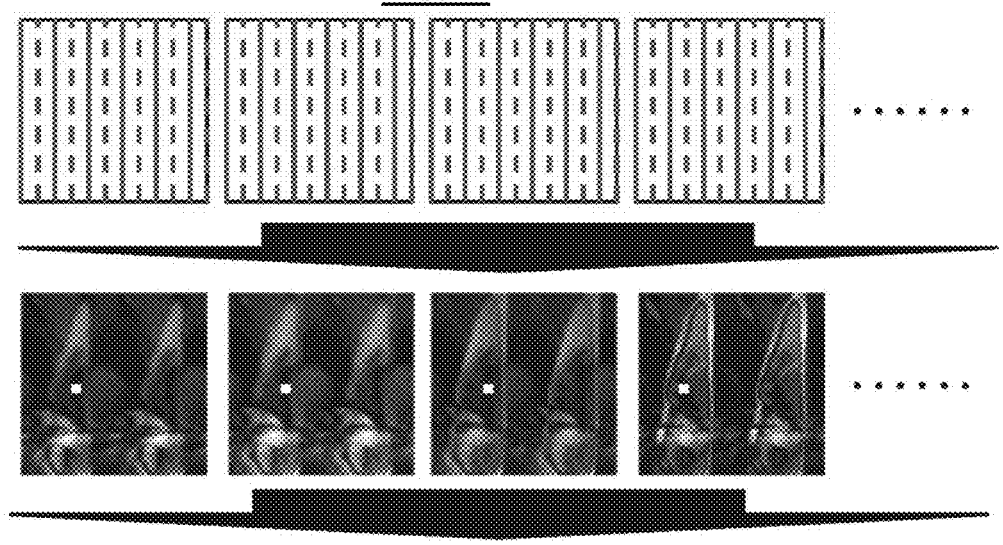
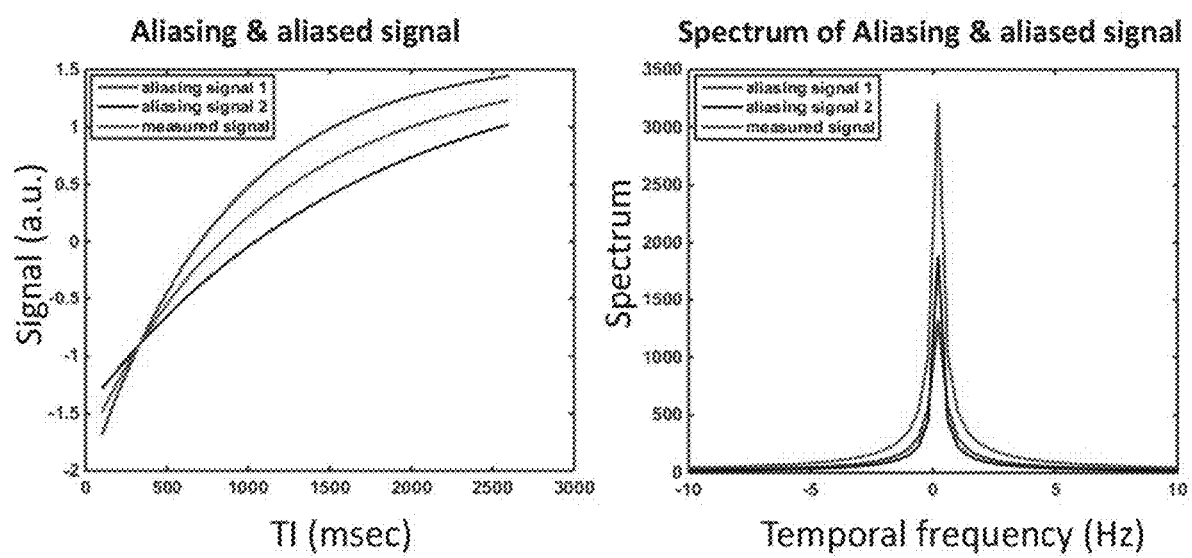

FIG. 3A
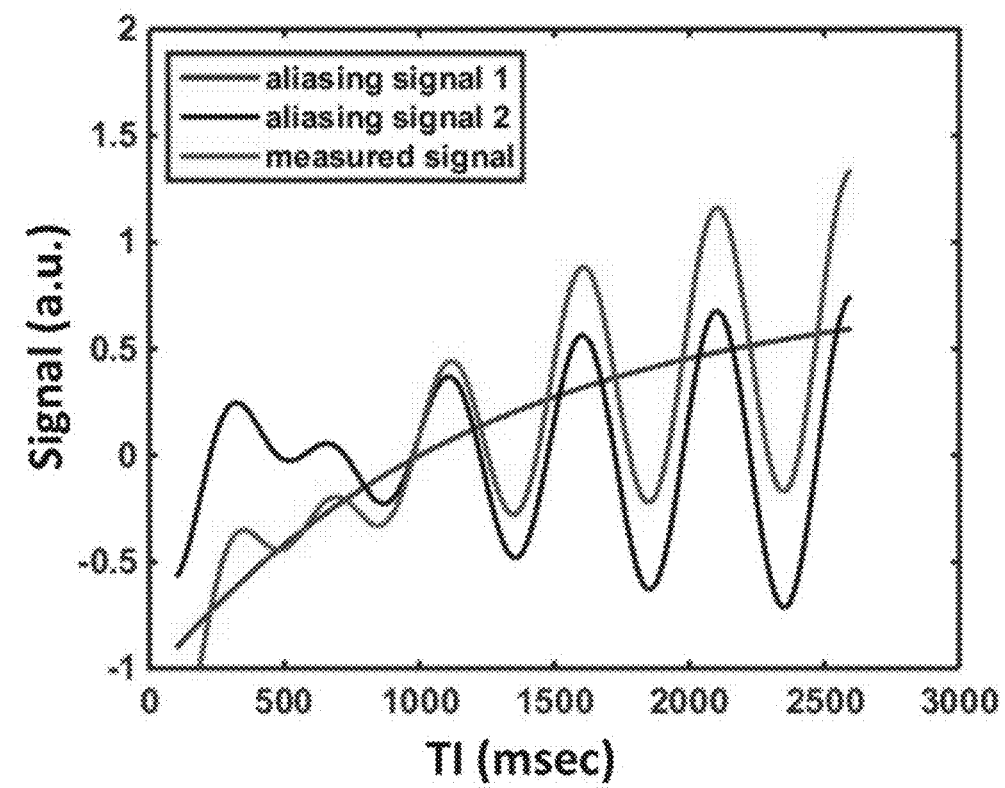
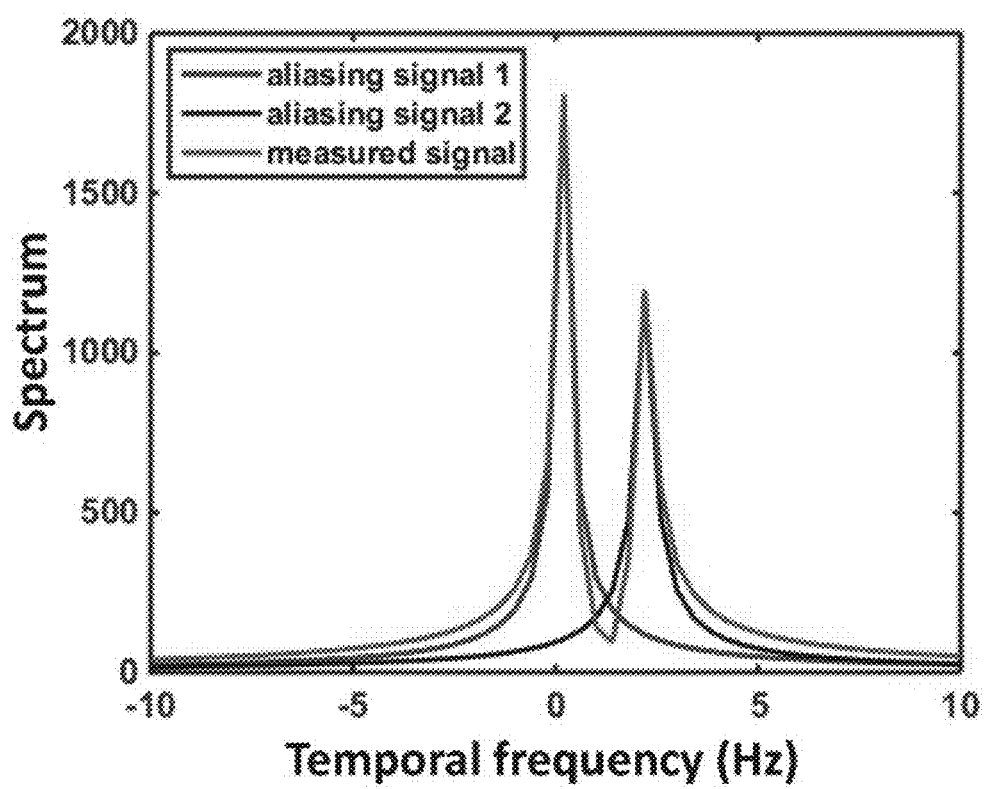

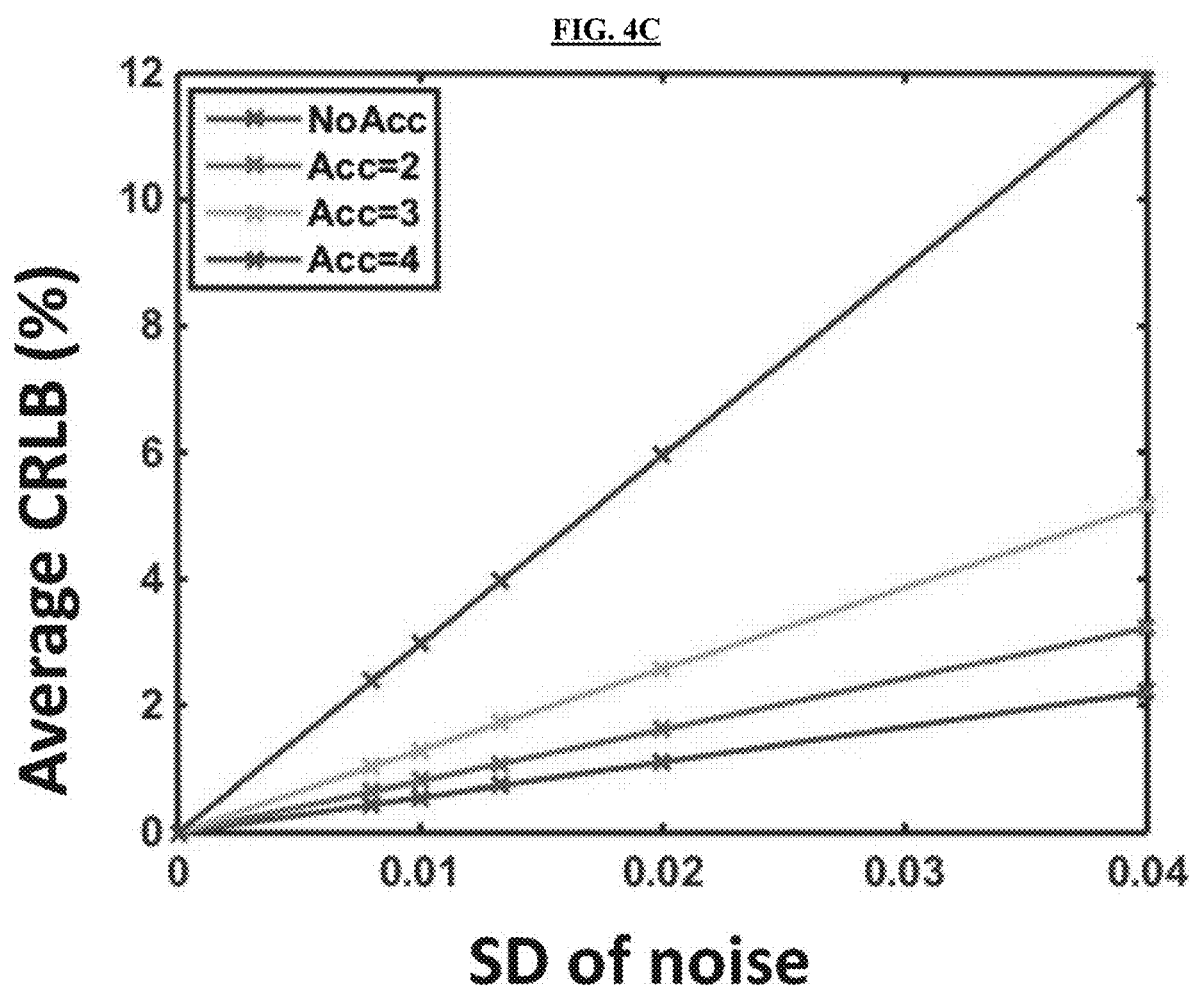

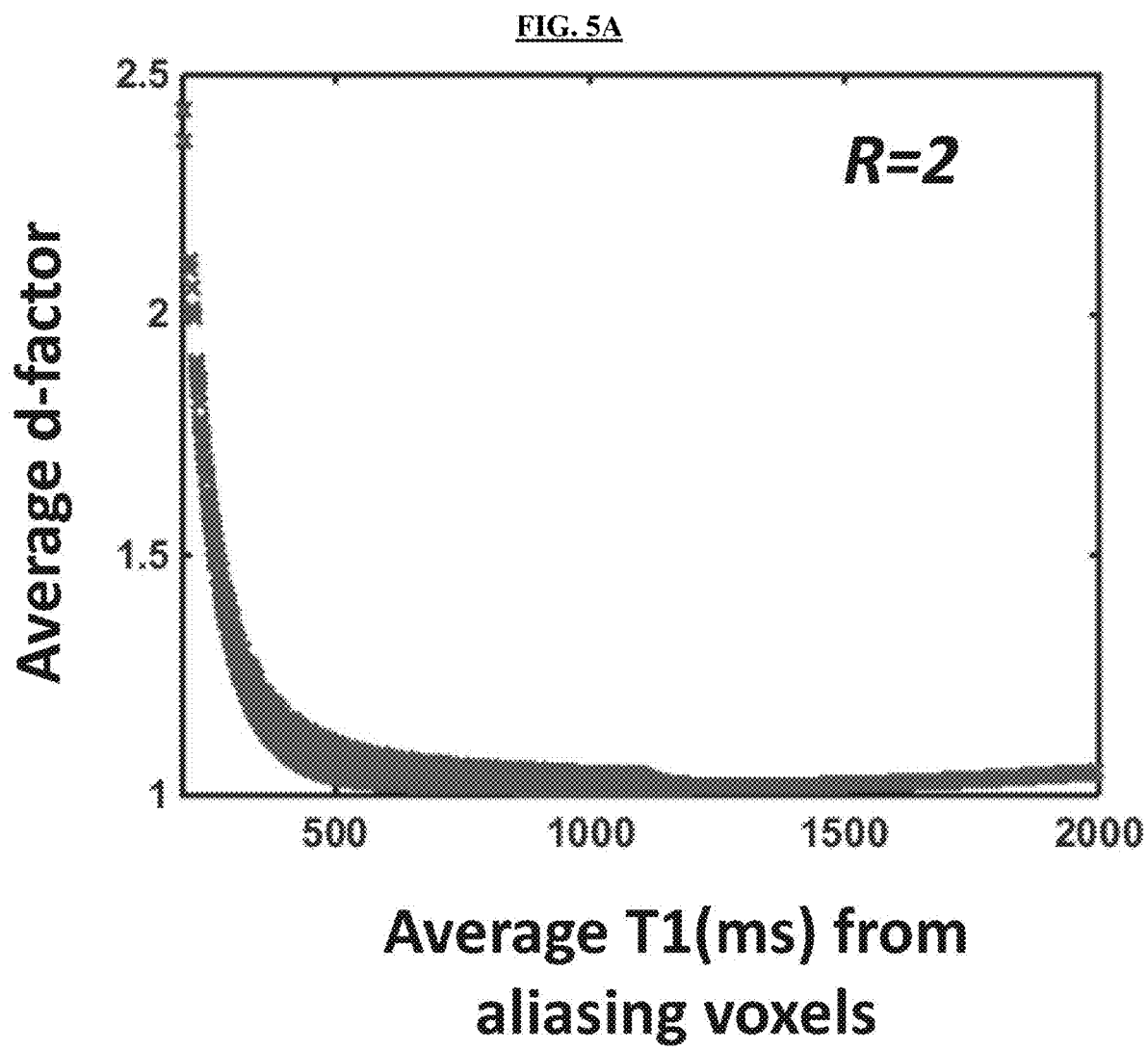

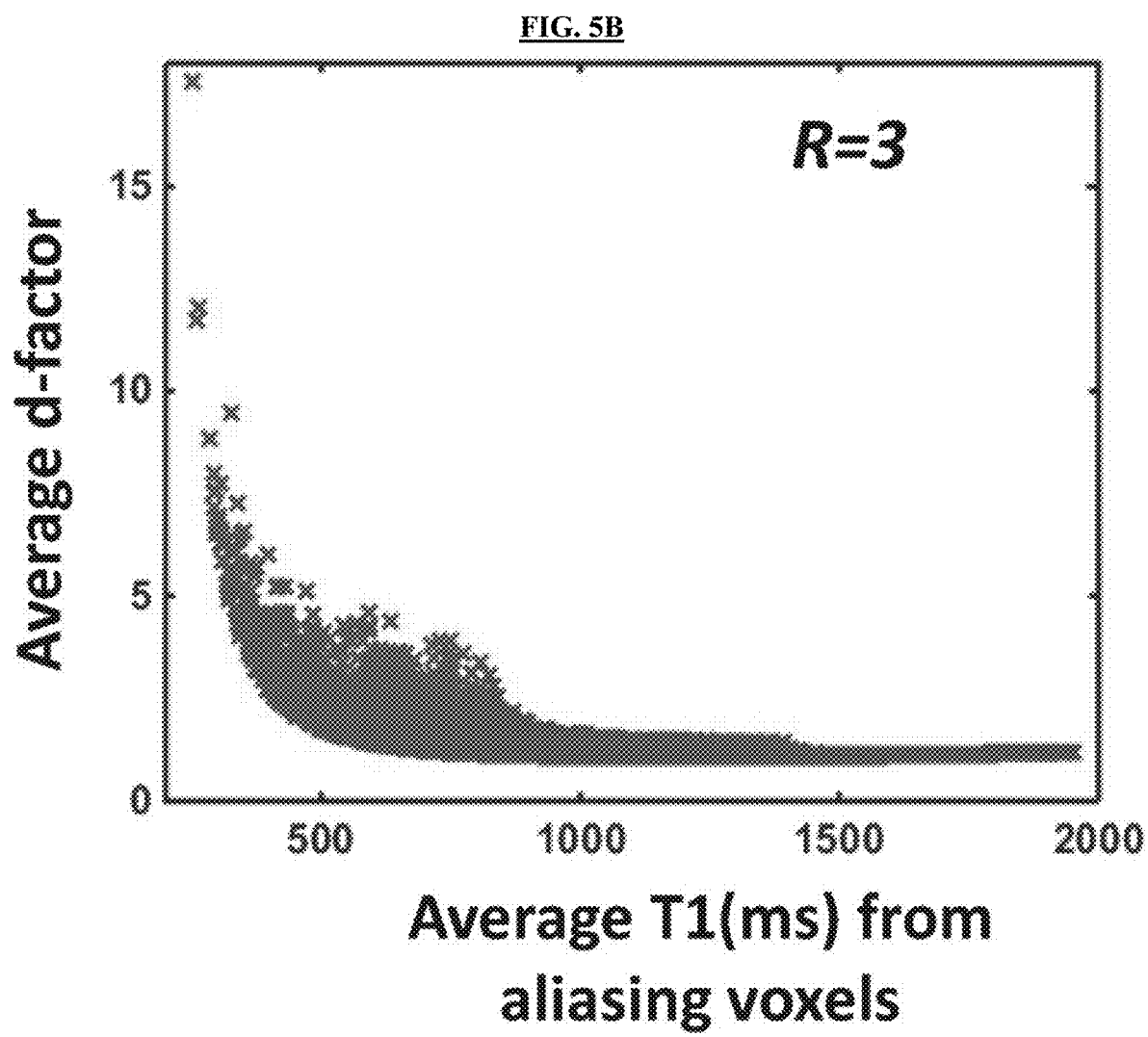

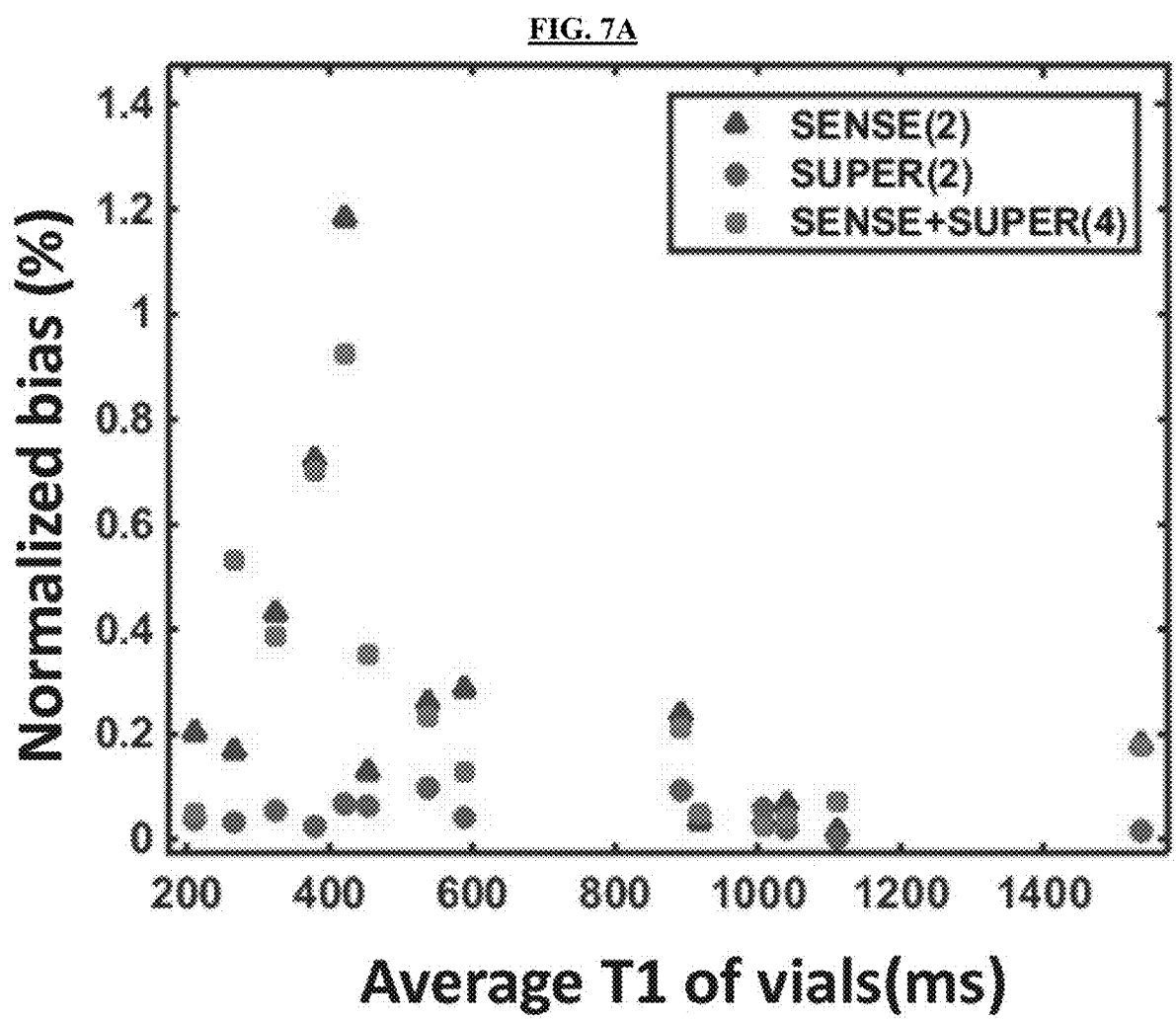

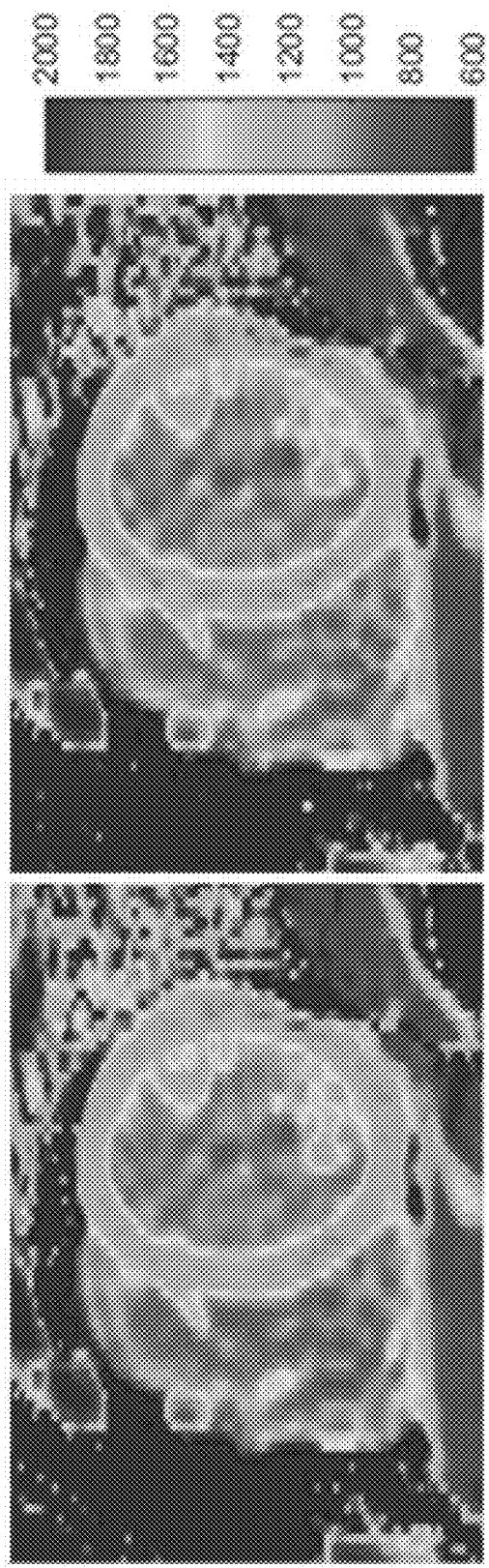

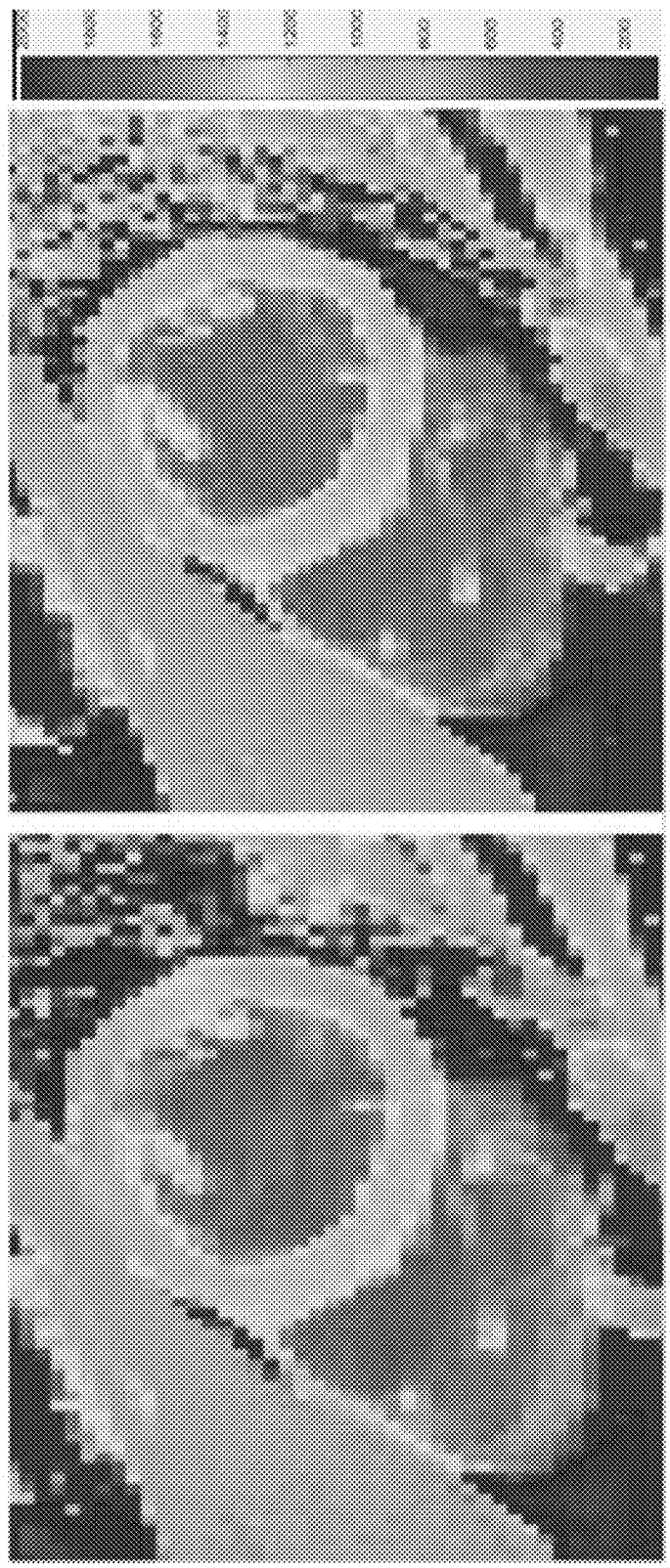

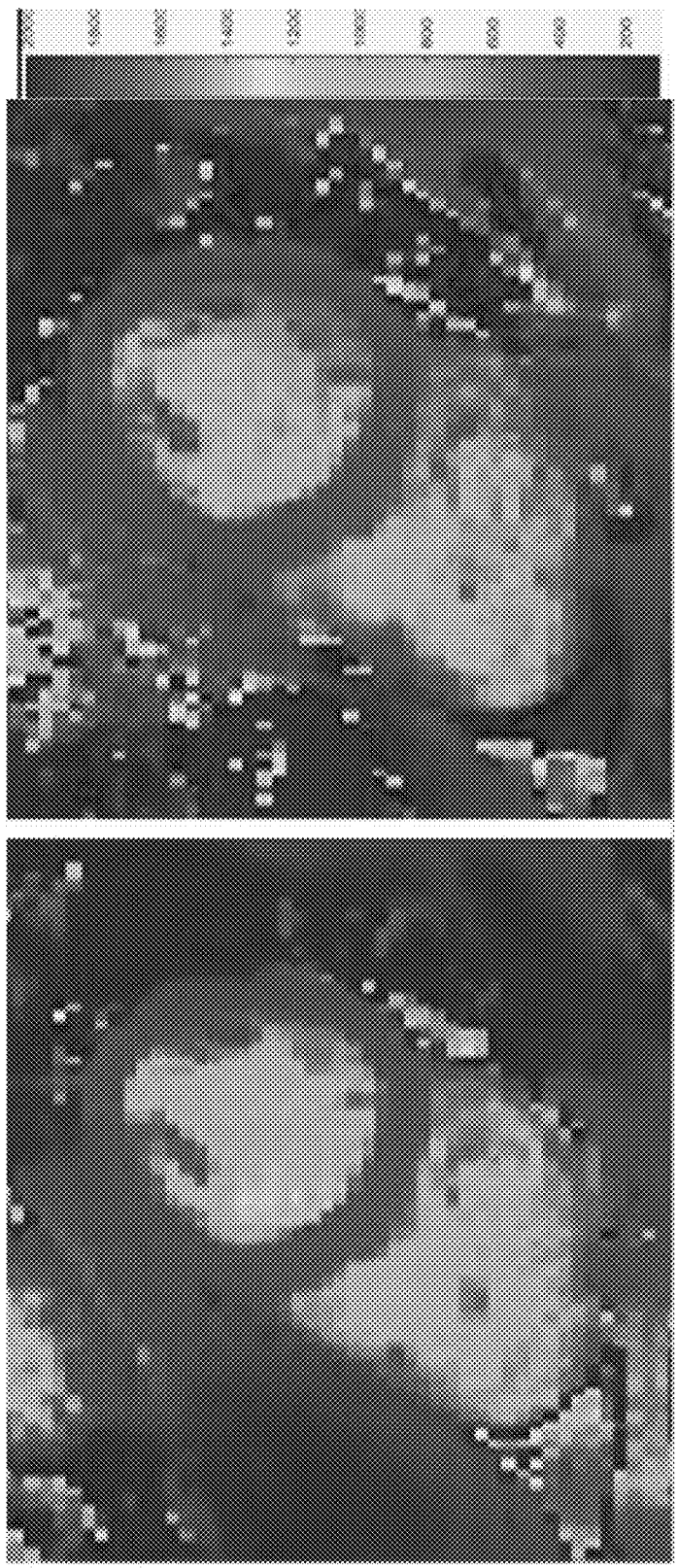

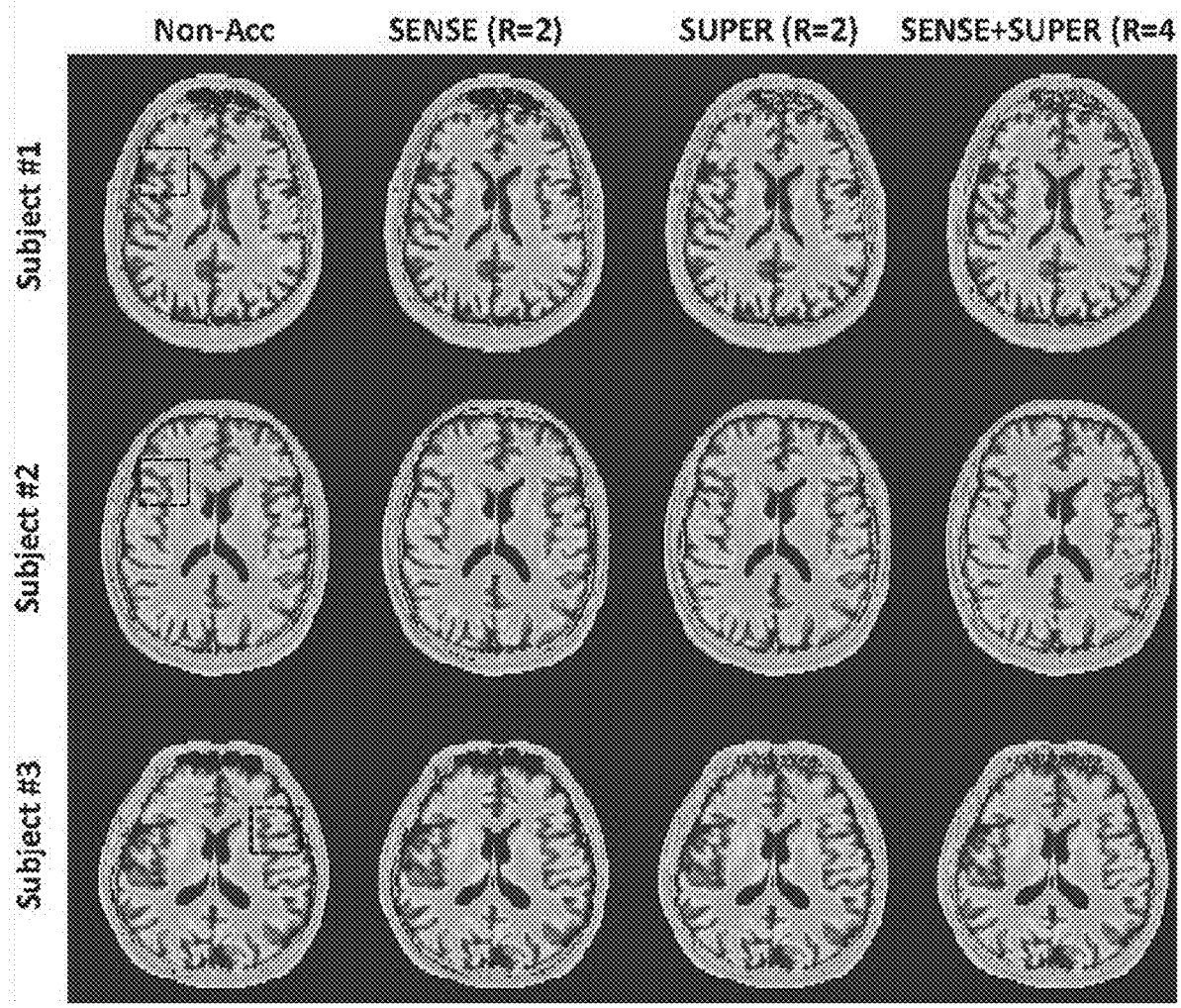

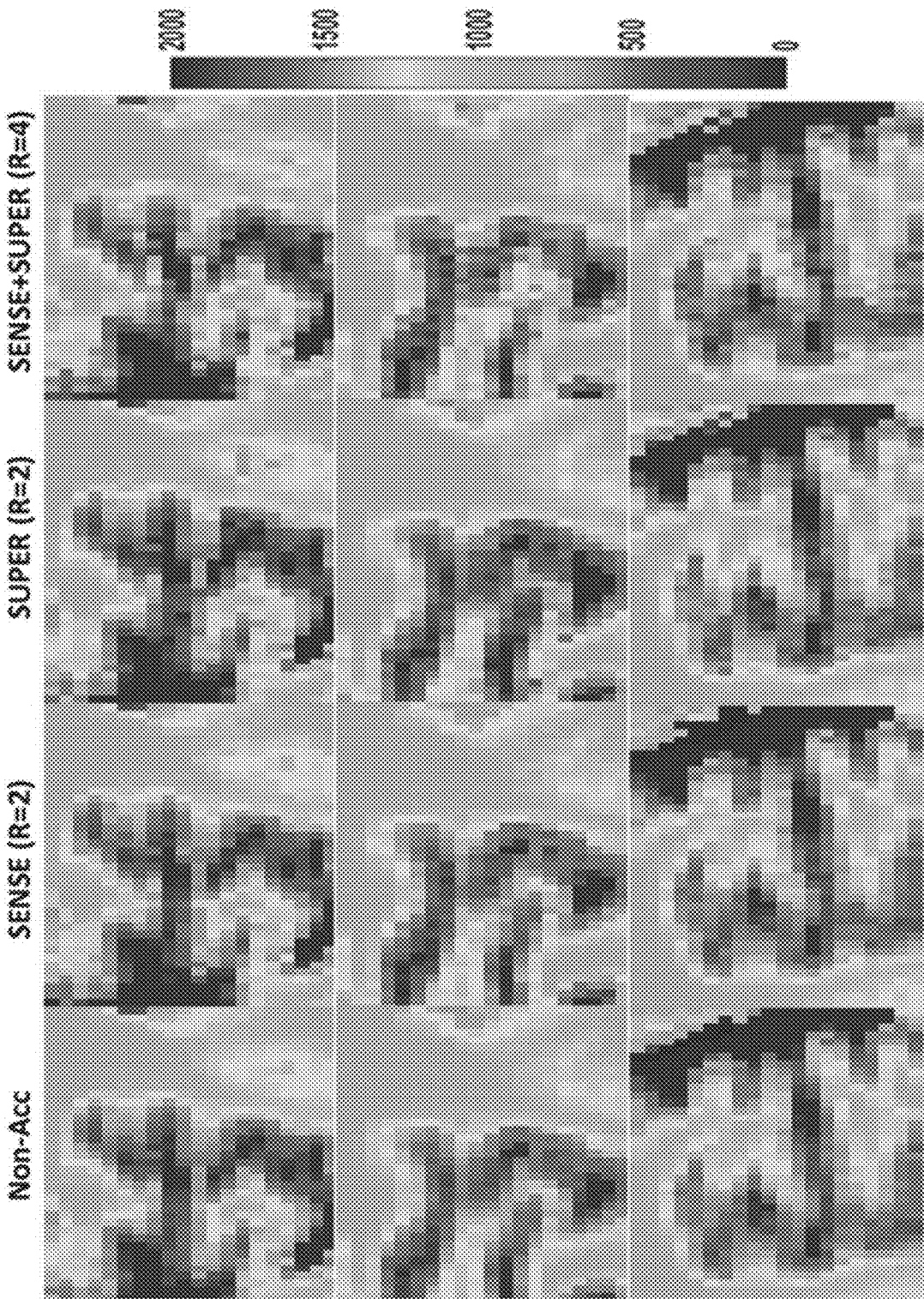

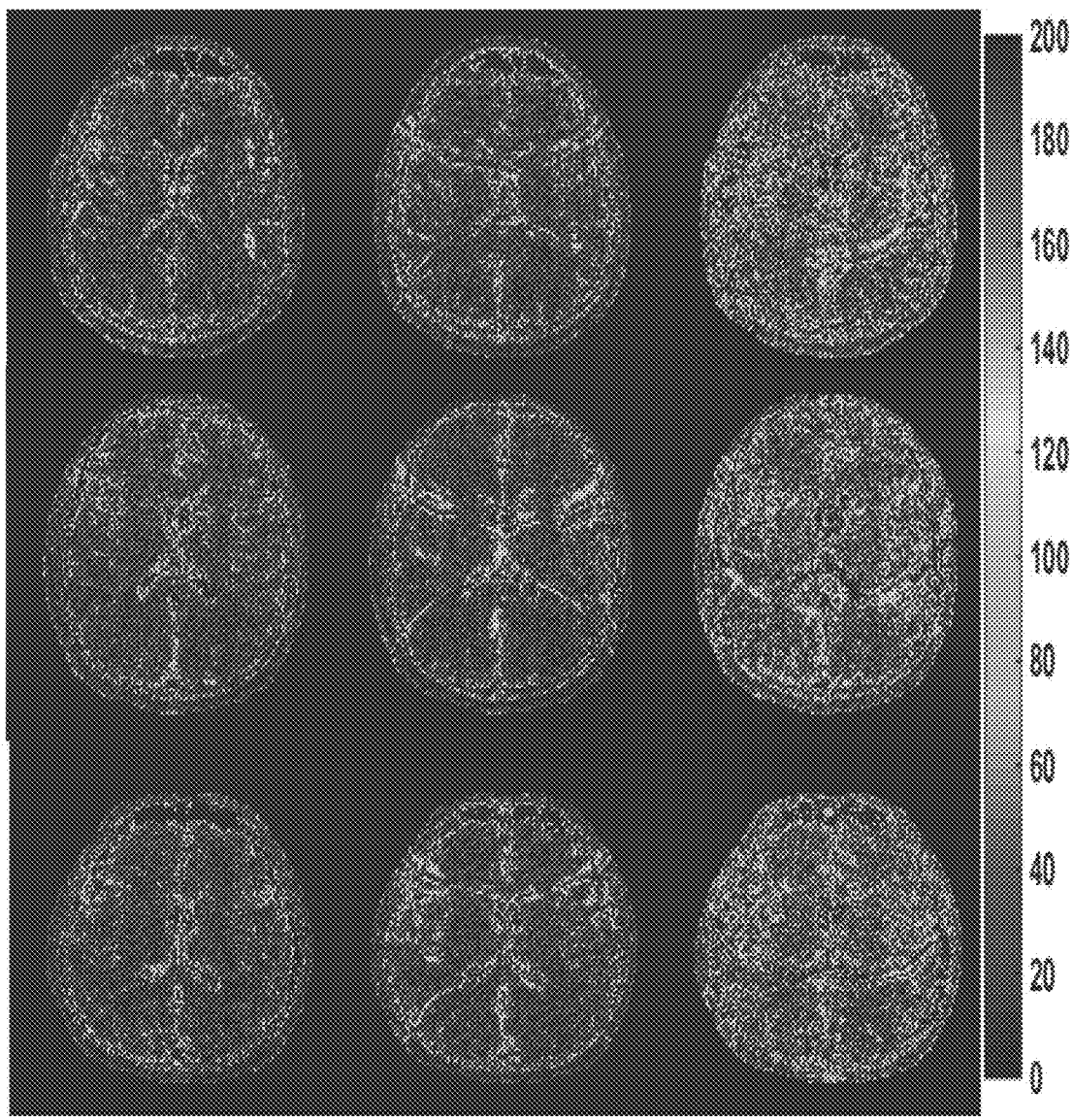

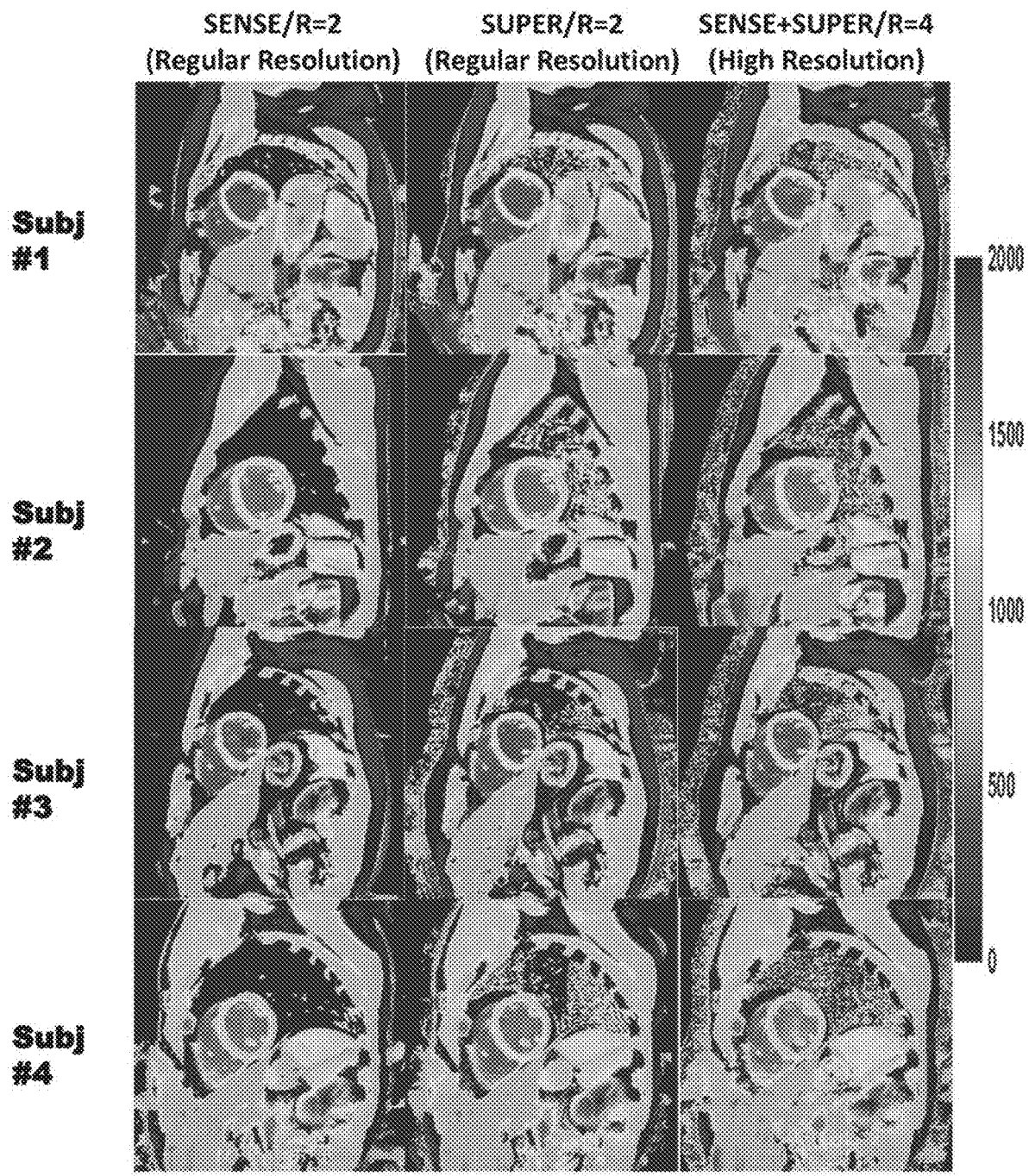

IMAGING ACCELERATION METHODS FOR MRI PARAMETER MAPPING

CROSS-REFERENCE TO RELATED APPLICATIONS

This application claims priority under 35 U.S.C. § 119(e) to U.S. Provisional Application No. 62/481,361, filed Apr. 4, 2017 which is incorporated herein by reference in its entirety.

STATEMENT REGARDING FEDERALLY SPONSORED RESEARCH OR DEVELOPMENT

This invention was made with government support under grant HL122560 awarded by National Institutes of Health. The government has certain rights in the invention.

BACKGROUND OF THE INVENTION

MRI parametric mapping includes a variety of important techniques for interrogating tissue properties. To date, different parametric mapping techniques, such as T1 mapping, T2 mapping, T2* mapping, 4D flow, and diffusion tensor imaging, have been developed. Many of these techniques have been applied in clinical practice for disease diagnosis and risk stratification. For example, T2 mapping has been commonly used in cardiovascular MRI as an alternative for the traditional T2 weighted imaging due to its reliable performance. However, despite the large body of parametric mapping techniques, parametric mapping still remains underused in clinical practice for several reasons. In one aspect, parametric mapping needs to acquire several images in order to reconstruct the parameter map. Acquisition of multiple images often dramatically increases the imaging duration, making the technique inefficient relative to those single-contrast imaging method. In another aspect, parametric mapping often calls for a more complicated reconstruction. In yet another aspect, many acceleration strategies, such as compressed sensing, accelerate the acquisition but also cause prolonged reconstruction.

In single-contrast imaging, many acceleration methods have been proposed to accelerate the data acquisition, such as partial Fourier techniques, parallel imaging, simultaneous multi-slice (SMS) imaging, and dynamic MRI. These techniques allow k-space to be undersampled, thus accelerating data acquisition. Within the same acquisition time, these techniques can be used to increase spatial resolution, acquire multiple slices, or increase temporal resolution. A common feature of these techniques is that they explore information redundancy in some data domain to reduce amount of necessary samples in k-space. For example, parallel imaging explores the information redundancy between different coil-weighted images, SMS between different coil-weighted slices, and dynamic MRI between different motion states of the heart. In addition, these techniques are very practical. For example, all of them use Cartesian k-space sampling, and their reconstructions are all computationally and memory efficient. The practicality facilitates smooth translation of these techniques into clinical utilization.

In parametric mapping, fast acquisition methods are often based on three strategies. The first strategy is simply using parallel imaging to accelerate each image separately. However, this strategy does not leverage any redundant information between the images. Therefore, there is no extra acceleration compared to single-contrast imaging. The second strategy is to undersample k-space and fill the missing samples by constraining the parametric mapping with physical models of the signal. The third strategy is to use compressed sensing, which can be applied to both spatial domain and temporal domain. Although powerful, most current methods using these strategies suffer from challenges. In one aspect, a non-Cartesian trajectory or random trajectory is typically used in these techniques. These trajectories need careful calibration to correct for the influence of eddy currents, which is especially a problem for applications that have frequently changeable imaging views. In another aspect, the reconstruction problem under these strategies typically is more complicated and inefficient, due to usage of the compressed sensing regularization and non-Cartesian trajectories. Unlike parallel imaging or SMS that have spatially localized reconstruction, these strategies typically involve an optimization algorithm that jointly updates the entire image in every iteration. Although parallel computation based on GPU can somewhat reduce the computational burden, GPU is relatively expensive and is not used world widely.

Standard parametric mapping methods such as T1 and T2 mapping thus suffer from long scan time and low resolution, because they require sampling multiple images along the relaxation curve. There remains a need in the art for methods and techniques that allow for high resolution and more efficient MRI parametric mapping with Cartesian k-space sampling and efficient reconstruction. Such methods should yield improved efficiency and resolution in MRI parameter mapping with clinically preferred reconstruction time. The present invention meets this need.

BRIEF DESCRIPTION OF THE INVENTION

In one aspect, the invention provides a method of imaging an object. In certain embodiments, the method comprises acquiring MRI signal data for the object using Cartesian sampling with undersampling of k-space in the phase-encoding direction at each time point of the signal dynamics, such that the undersampling pattern shifts circularly in each time frame along the phase-encoding direction and the temporal signal at spatially equidistant voxels is modulated and combined into a single aliased signal. In certain embodiments, the method comprises reconstructing an image of the object using a physical model that dictates the signal dynamics, whereby at each query voxel an equation is solved to resolve each individual temporal signal within the single aliased signal, thus yielding one or more parameters of the physical model.

In certain embodiments, the one or more parameters are selected from the group consisting of T1 relaxation rate, T2 relaxation rate, proton density, T2* relaxation rate, B0 field strength, B1 field strength, blood flow, apparent diffusion coefficient, and diffusion tensor.

In certain embodiments, the k-space is undersampled by uniformly skipping a number of lines in the phase-encoding direction and the undersampling pattern circularly shifts in the phase-encoding direction at each subsequent time point of the signal dynamics. In other embodiments, the largest undersampling rate is restricted to the largest integer which is less than K/M; where K is the number of images and M is the number of parameters in the physical model.

In certain embodiments, the number of parameters per voxel is equal to the average number of k-space samples per voxel.

In certain embodiments, the equation at each query voxel is solved by minimizing a least-squares cost function. In other embodiments, the least-squares cost function is:

$$\left\| I_n(m, t_l) - \sum_{r=1-\lceil \frac{R}{2} \rceil}^{\lfloor \frac{R}{2} \rfloor} w_r(t_l) s_{n-r\frac{N}{R}}(m) f\left(\vec{x}_{n-r\frac{N}{R}}, t_l\right) \right\|^2$$

wherein:

$I_n(m,t_l)$ is the aliased signal at voxel n, coil index m, and the time point $t_l$;

$w_r(\bullet)$ is the modulation function for the aliasing signal at voxel $$n - r\frac{N}{R};$$

$$s_{n-r\frac{N}{R}}(m)$$

is the coil sensitivity of the mth coil at the aliasing voxel $$n - r\frac{N}{R};$$

$f(\bullet, t_l)$ is the underlying signal model;

$$\vec{x}_{n-r\frac{N}{R}}$$

is the unknown parameter at the aliasing voxel $$n - r\frac{N}{R};$$

R is the acceleration factor;

N is the total number of lines in the phase-encoding direction, and the symbols $\lfloor \bullet \rfloor$ and $\lceil \bullet \rceil$ represent the largest integer less than and the smallest integer greater then the argument, respectively.

In certain embodiments, the $f(\bullet, t_l)$ and $$\vec{x}_{n-r\frac{N}{R}}$$

terms are substituted for a specific physical model. In other embodiments, the $f(\bullet, t_l)$ and $$\vec{x}_{n-r\frac{N}{R}}$$

terms are replaced $$f(\cdot, t_l) = A - B\exp\left(-\frac{t_l}{T1}\right) \text{ and } \vec{x}_{n-r\frac{N}{R}} = \left[A_{n-r\frac{N}{R}}, B_{n-r\frac{N}{R}}, T1_{n-r\frac{N}{R}}\right]^T$$

where $[\ldots]^T$ represents the vector transpose. In yet other embodiments, the $f(\bullet, t_l)$ and $$\vec{x}_{n-r\frac{N}{R}}$$

terms are replaced by $$f(\cdot, t_l) = A\exp\left(-\frac{t_l}{T2}\right) \text{ and } \vec{x}_{n-r\frac{N}{R}} = \left[A_{n-r\frac{N}{R}}, T2_{n-r\frac{N}{R}}\right]^T.$$

In certain embodiments, the least-squares cost function is minimized by an unconstrained optimization algorithm or a dictionary-based exhaustive search algorithm. In other embodiments, the minimization of the least-squares cost function is solved using an algorithm selected from the group consisting of steepest descend, conjugate gradients, Gauss-Newton and Levenberg-Marquardt. In yet other embodiments, the minimization of the least-squares cost function is solved using an algorithm selected from the group consisting of Gauss-Newton and Levenberg-Marquardt.

In certain embodiments, the imaging method is a medical imaging method. In other embodiments, the medical imaging method is magnetic resonance imaging (MRI). In yet other embodiments, the medical imaging method is adapted and configured to image one or more organs selected from the group consisting of the heart, liver, kidneys, abdomen, breast, prostate, brain, knee, and any muscularskeletal system. In yet other embodiments, the medical imaging method is at least one selected from the group consisting of cardiac tissue characterization, detection of edema, detection of iron overload in the heart and liver, water-fat separation imaging, clinical neuralimaging, functional MRI, tumor imaging, flow mapping, mapping of apparent diffusion coefficient, diffusion tensor imaging, and magnetic resonance fingerprinting.

In certain embodiments, the method further comprises one or more additional imaging acceleration methods selected from the group consisting of SENSE (parallel imaging), partial Fourier techniques, and simultaneous multi-slice techniques.

In certain embodiments, the method is adapted and configured for 2D parametric mapping applications. In other embodiments, the method is adapted and configured for 3D parametric mapping applications.

In certain embodiments, the noise amplification due to the acceleration is quantified by the dynamics-factor (d-factor) in the absence of parallel imaging, or the dynamics-geometry-factor (dg-factor) in the presence of parallel imaging.

BRIEF DESCRIPTION OF THE DRAWINGS

The following detailed description of specific embodiments of the invention will be better understood when read in conjunction with the appended drawings. For the purpose of illustrating the invention, there are shown in the drawings specific embodiments. It should be understood, however, that the invention is not limited to the precise arrangements and instrumentalities of the embodiments shown in the drawings.

FIGS. 1B-1D are 3 examples of shift undersampling patterns. FIG. 1B is a scheme showing 2-fold shift undersampling; FIG. 1C is a scheme showing 4-fold shift undersampling; and FIG. 1D is a scheme showing 4-fold shift undersampling pattern for combined parallel imaging and SUPER.

FIGS. 2A-2B are a pair of diagrams comparing shift undersampling and static undersampling. FIG. 2A shows how shift undersampling creates a continuously shifted aliasing pattern, which at each voxel is virtually a combination of the two aliasing signal modulated with different frequency. In temporal frequency domain, the modulation separates the two aliasing spectra, providing a well-conditioned de-aliasing problem. FIG. 2B shows how static undersampling uses an identical undersampling scheme for all TIs, causing a direct combination of the two aliasing signal as well as the two aliasing spectra, leading to an ill-conditioned de-aliasing problem.

FIGS. 3A-3B are illustrations of the relationship between d-factor and the value of T1 in SUPER T1 mapping. FIG. 3A is a set of graphs showing two voxels aliased due to shift undersampling having a T1 of 900 ms and 1200 ms, resulting in a d-factor of 1.2 for both voxels. FIG. 3B shows that changing the T1 of the second voxel to 100 ms increased the d-factor to 2.0 and 2.1 for the two voxels. This was because a more dynamic signal transformed to a "wider" and "flatter" spectrum, which aliased more with the first spectrum, causing a poor-conditioned de-aliasing problem and increased noise amplification. Other parameters of the simulation were: TI=100 ms, 350 ms, 600 ms, 850 ms, 1100 ms, 1350 ms, 1600 ms, 1850 ms, 2100 ms, 2350 ms, and 2600 ms; 3-parameter T1 model: signal=A−Bexp(−t/T1).

FIGS. 4A-4C are plots of normalized bias of the T1 estimate (FIG. 4A), normalized standard deviation of the T1 estimate (FIG. 4B), and average Cramer-Rao lower bound (CRLB) with respect to different noise levels and acceleration factors (FIG. 4C).

FIGS. 5A-5C are plots of d-factor averaged over the aliasing voxels with respect to the T1 averaged over the aliasing voxels for reduction rate of 2 (FIG. 5A), 3 (FIG. 5B), and 4 (FIG. 5C).

FIGS. 7A-7B are plots of the normalized bias of the T1 estimate and the normalized standard deviation (SD) of the T1 estimate over each vial ROI with respect to its average T1 for different acceleration methods.

FIGS. 8A-8B are examples of low-resolution cardiac T1 maps (MOLLI, 3-3-5, image size: 160×84) reconstructed with full sampling of k-space (FIG. 8A) and shift undersampling of k-space by a factor of 2 (FIG. 8B), using SUPER.

FIGS. 9A-9B are examples of cardiac T1 maps at a standard resolution (MOLLI, 3-3-5, image size: 192×144) reconstructed with SENSE factor of 2 (FIG. 9A) and SUPER factor of 2 (FIG. 9B).

FIGS. 11A-11B are representative standard-resolution cardiac T2 maps reconstructed with SENSE factor of 2 (FIG. 11A) and SUPER factor of 2 (FIG. 11B).

FIGS. 17A-17B are representative brain T1 maps from 3 healthy subjects reconstructed by non-accelerated T1 mapping (gold standard), SENSE acceleration (2-fold undersampling), SUPER acceleration (2-fold undersampling), and SENSE+SUPER acceleration (4-fold undersampling). FIG. 17B is a local amplification of each T1 map with the area of amplification shown with a black box in the first column of FIG. 17A.

FIG. 17C is a set of difference T1 maps between the non-accelerated T1 mapping result and the result of the other 3 methods as reported in FIG. 17A.

FIG. 18A is a set of representative cardiac T1 maps from 4 healthy subjects reconstructed by SENSE (2-fold undersampling) with a regular resolution, SUPER (2-fold undersampling) with a regular resolution, and SENSE+SUPER (4-fold undersampling) with an improved resolution.

DETAILED DESCRIPTION OF THE INVENTION

Figure 1A:
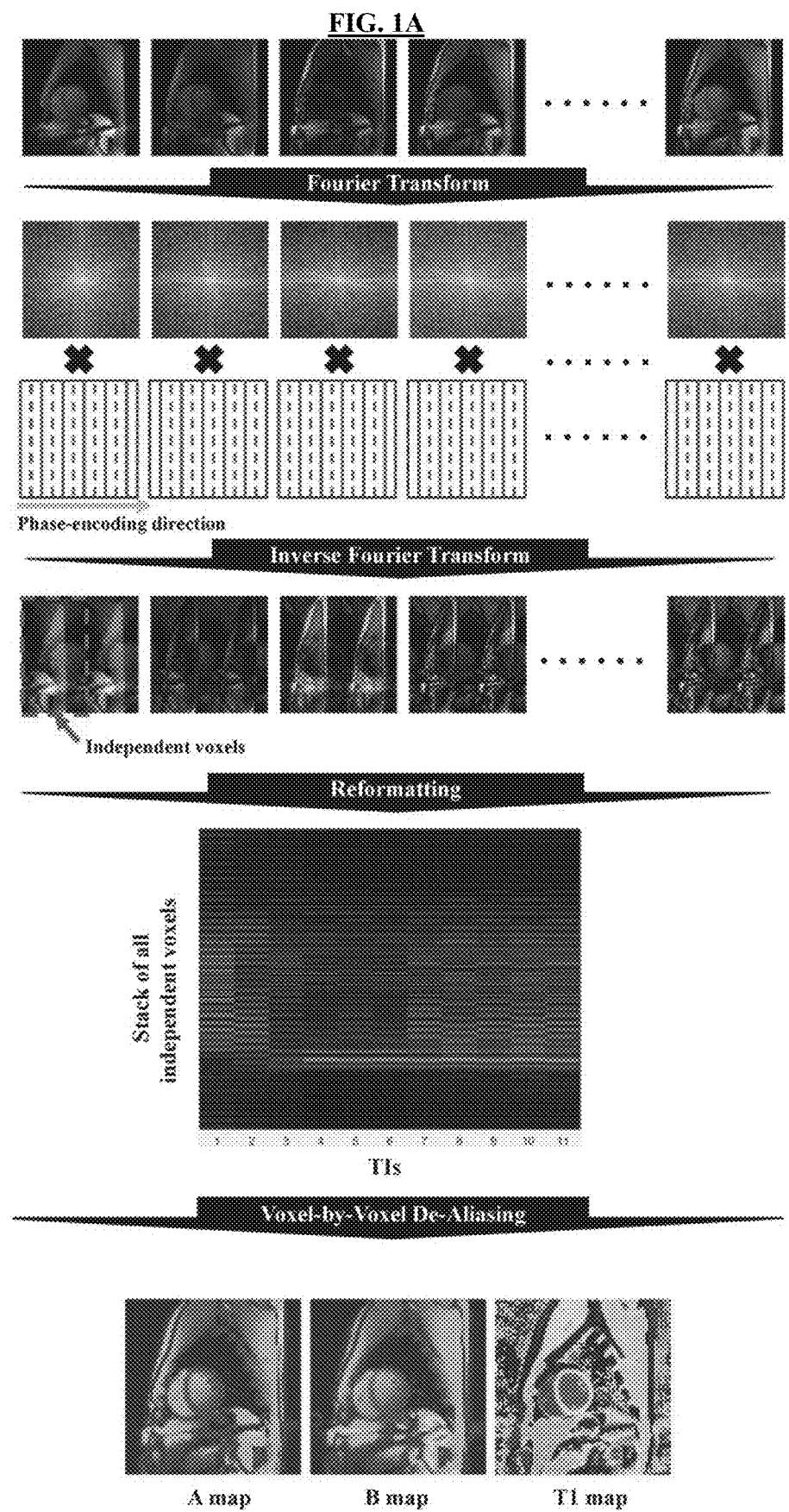
FIG. 1A is an exemplary outline of the SUPER method in accelerating cardiac T1 mapping. Briefly, eleven TIs were acquired (top) with k-space (second from top) undersampled along the phase-encoding direction (third from top), resulting in 11 aliased images (third from bottom). Signals in the left half (independent voxels) of the image space were reformatted into a reconstruction matrix (second from bottom), to which a model-based de-aliasing reconstruction algorithm was applied at each row to reconstruct the 3 parameter maps (bottom).
Figure 1B:
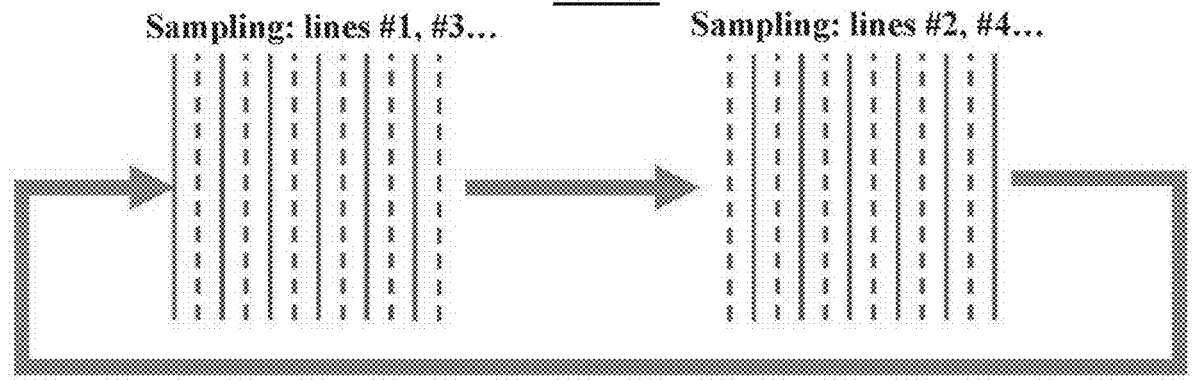

The present invention provides in one aspect a novel acceleration and reconstruction method, dubbed SUPER ("Shift Undersampling improves Parametric mapping Efficiency and Resolution"), which allows for increased efficiency and resolution in parametric mapping. In certain embodiments, the method accelerates Cartesian k-space sampling, which is the major sampling scheme in clinical MRI. Cartesian k-space sampling is a preferred sampling scheme in clinical MRI because it is free from artifacts caused by eddy currents or gradient delays. In other embodiments, the method has a comparable reconstruction time to the standard voxel-by-voxel reconstruction methods of parametric mapping, thereby providing an overall more efficient method than the prior art.

In certain embodiments, the invention provides an acceleration method for parametric mapping that satisfies three conditions: 1) it uses Cartesian sampling, 2) no regularization, such as compressed sensing, is needed and 3) it has fast, spatially localized reconstruction. In other embodiments, the method of the invention accelerates parametric mapping by a factor of 2-4 by using physical models. In yet other embodiments, the method of the invention is practical for clinical translation and can be used to image a variety of tissues in a subject and can benefit a wide range of MRI clinical applications.

Definitions

As used herein, each of the following terms has the meaning associated with it in this section.

Unless defined otherwise, all technical and scientific terms used herein have the same meaning as commonly understood by one of ordinary skill in the art to which this invention belongs. Although any methods and materials similar or equivalent to those described herein can be used in the practice or testing of the present invention, exemplary methods and materials are described.

Generally, the nomenclature used herein and the laboratory procedures in the field of medical imaging and statistical parametric mapping are those well-known and commonly employed in the art.

As used herein, the articles "a" and "an" refer to one or to more than one (i.e., to at least one) of the grammatical object of the article. By way of example, "an element" means one element or more than one element.

As used herein, the term "about" is understood by persons of ordinary skill in the art and varies to some extent on the context in which it is used. As used herein when referring to a measurable value such as an amount, a temporal duration, and the like, the term "about" is meant to encompass variations of ±20% or ±10%, more preferably ±5%, even more preferably ±1%, and still more preferably ±0.1% from the specified value, as such variations are appropriate to perform the disclosed methods.

The term "Cartesian k-space sampling" as used herein refers to a major k-space sampling scheme that samples k-space line-by-line along the phase-encoding direction.

The term "Cartesian undersampling" as used herein refers to an undersampling scheme of k-space that skips sampling of a certain number of Cartesian k-space lines, usually in an interleaved pattern. For example, a 2-fold Cartesian undersampling only samples even lines or odd lines of k-space.

As used herein, the term "k-space" refers to Fourier transform of a 2D or 3D image.

The phrase "Magnetic Resonance Imaging" or "MRI" as used herein refers to the process by which certain nuclei, when placed in a magnetic field, absorb and release energy in the form of radio waves that are analyzed by a computer, thereby producing an image (e.g., of structures, human anatomy, and physiological information). The present subject matter and methods can be employed with MRI generated with MRI equipment from any manufacturer. In some embodiments, the MRI equipment or scanner shall have a scanner housing with a magnet with a typical magnetic field (Bo), ranging from about 0.5 to about 7 Tesla or higher, positioned inside the housing. In biomedical applications, the subject to be imaged (e.g., a human body) lies on the scanner table or is disposed within the bore of the MRI equipment and the hydrogen and other nuclei in the subject are realigned in certain directions. Magnetic field gradient coils are arranged near the imaged subject to superimpose on Bo an additional selected spatially-varying magnetic field. One or more radiofrequency (RF) coils are arranged inside the bore of the magnet to transmit RF excitation and inversion pulses (Bi). The RF coils also measure the RF magnetic resonance signal emitted from the imaged subject. The gradient coils and the RF transmitter coils are turned on and off at specific strengths and for specific duration according to a predetermined sequence of actions collectively called an imaging sequence. At specific time points during the execution of the imaging sequence, the RF receiver coils measure the RF signals emitted from the body. Images of structures such as body parts or organs are created from the measured RF signals during or after the completion of the imaging sequence.

The terms "parametric mapping" or "parameter mapping" as used herein refer to an imaging method in MRI that reconstructs one or a number of maps of some physical quantities, such as T1 relaxation rate, T2 relaxation rate, T2* relaxation rate, proton density, B0 field strength, and B1 field strength, and biological properties, such as blood flow, apparent diffusion coefficient, and diffusion tensor. These physical quantities and biological properties are then used to aid clinical diagnosis, risk stratification, and tissue characterization. Depending on the specific application, parametric mapping typically need more than 2 images, acquired at different time points in the signal dynamics, to extract the underlying parameters.

As used herein, the term "shift undersampling" refers to an undersampling scheme of k-space in parametric mapping where the undersampling of k-space of an image at each time point is a circularly shifted in the next time point, if available. For example, a 2-fold shift undersampling for 4 time points samples odd k-space lines of the first and the third image and even k-space lines of the second and fourth image.

The term "single-contrast imaging" as used herein is an imaging method that provides a single image that is weighted by certain parameters, such as T1 relaxation, T2 relaxation, T2* relaxation, proton density, blood flow, and diffusion of tissue. In contrast to parametric mapping that provides quantitative information about the tissue or local magnetic field, single-contrast imaging provides a qualitative depiction of the distribution of these quantities in the field of view.

The term "signal dynamics" as used herein refers to dynamic variation of a signal from an object in an MRI scanner, usually dictated by some MRI parameters or biological properties, such as T1 relaxation rate, T2 relaxation rate, T2* relaxation rate, proton density, B0 field strength, B1 field strength, blood flow, apparent diffusion coefficient, and diffusion tensor. For example, the magnetization of a bulk of tissue follows a T1 relaxation to return to its equilibrium state after a RF pulse is a type of signal dynamics dictated by the T1 relaxation rate of the tissue.

The term "signal model" as used herein refers to a mathematical modeling of the signal dynamics that describes the relationship between the underlying parameters and the signal dynamics. There may be more than one model that can explain the underlying signal dynamics to a certain degree of accuracy. For example, T1 relaxation can be modeled by $A(1-2*\exp(-t/T1))$ and $A-B*\exp(-t/T1)$, both of which are commonly used in literature, known as the 2-parameter model (parameters: A and T1), and the 3-parameter model (parameters: A, B, and T1) for T1 relaxation.

The term "spatial domain" as used herein refers to a normal image space. In certain embodiments, all images or maps reside in a 2D or 3D spatial domain. Without further explicit instruction, in certain embodiments it is assumed that the spatial domain ranges from $-N/2$ to $N/2-1$ in the phase-encoding direction, where N is the number of voxels in the phase-encoding direction. Without loss of generality, N is assumed to be an even number. The number of voxels in the frequency-encoding direction is not limited and therefore can be any positive integer.

The term "subject" as used herein shall be understood to include any animal including mammals including, but not limited to, humans and primates.

The term "time domain" as used herein refers to analysis of mathematical functions with respect to time. All signal dynamics resides in a time domain that starts at time 0. When parametric imaging is performed, the temporal signal is sampled at multiple time points in the time domain.

Throughout this disclosure, various aspects of the invention may be presented in a range format. It should be understood that the description in range format is merely for convenience and brevity and should not be construed as an inflexible limitation on the scope of the invention. Accordingly, the description of a range should be considered to have specifically disclosed all the possible sub-ranges as well as individual numerical values within that range and, when appropriate, partial integers of the numerical values within ranges. For example, description of a range such as from 1 to 6 should be considered to have specifically disclosed sub-ranges such as from 1 to 3, from 1 to 4, from 1 to 5, from 2 to 4, from 2 to 6, from 3 to 6 etc., as well as individual numbers within that range, for example, 1, 2, 2.7, 3, 4, 5, 5.3, and 6. This applies regardless of the breadth of the range.

Non-limiting abbreviations used throughout the disclosure are provided herein: ADC, apparent diffusion coefficient; bSSFP, Balanced Steady-State Free Precession; CRLB, Cramer Rao Lower Bound; CSF, cerebrospinal flow; IR TSE, inversion recovery turbo spin echo; GPU, Graphics processing unit; MOLLI, Modified Look-Locker Inversion recovery; MRI, Magnetic resonance imaging; ROIs, Regions of interest; SE IR, spin echo inversion recovery; SENSE, Sensitivity Encoding; GRAPPA, Generalized Autocalibrating Partially Parallel Acquisitions; SMS, Simultaneous multi-slice; SNR, Signal-to-noise ratio; SUPER, Shift Undersampling improves Parametric mapping Efficiency and Resolution; TE, echo time; TI, inversion time; TSE, turbo spin echo.

Methods

In one aspect, the invention provides a method (SUPER). In certain embodiments, the method comprises acceleration of data acquisition. In certain embodiments, the method comprises reconstruction.

In certain embodiments, the method is an imaging method comprising acquiring MRI signal data. In certain embodiments, the method comprises using Cartesian sampling with undersampling of k-space in the phase-encoding direction at each time point of the signal dynamics, such that the undersampling pattern shifts circularly in each time frame along the phase-encoding direction and the temporal signal at spatially equidistant voxels is modulated and combined into a single signal. In certain embodiments, the method comprises reconstructing an image by solving an equation to resolve each individual temporal signal within the combined single signal, wherein the solution to the equation yields one or more parameters of the underlying application.

In certain embodiments, the acquisition aims to undersample k-space and maintain the reconstruction as a feasible and well-conditioned problem. This can be achieved, for example, by Cartesian undersampling of k-space with a circular shifting pattern in the time domain. In other embodiments, the undersampling pattern creates a modulated aliasing of voxels in the phase encoding direction, which helps to recover the original relaxation signal from each aliasing voxel.

In certain embodiments, the undersampling rate is determined by the number of images and the number of parameters in the physical model used in the reconstruction. In certain embodiments, the largest undersampling rate is restricted to the largest integer which is less than K/M; where K is the number of images and M is the number of parameters in the physical model. For example, for the 2-parameter T1 relaxation model, $A(1-2*\exp(-t/T1))$, there are 2 parameters, thus M=2. If only 2 images are acquired during the signal dynamics, i.e. K=2, the largest undersampling rate is 1 (no acceleration is possible). If 4 images are acquired during the signal dynamics, i.e. K=4, the largest undersampling rate is 2. As another example, for the 3-parameter T1 relaxation model, $A-B*\exp(-t/T1)$, an undersampling rate of 2 requires at least 6 images. As another example, the T2 relaxation mono-exponential model, $A*\exp(-t/T2)$, has 2 parameters and therefore requires at least 4 images to achieve a undersampling rate of 2.

In certain embodiments, the number of parameters per voxel is equal to the average number of k-space samples per voxel ("full efficiency" scenario). In that way, the data acquisition can be considered "fully efficient", because a further decrease of k-space samples, i.e. higher acceleration, would render the reconstruction ill-posed, i.e. having more than one solutions. For example, if 4 images during the T2 relaxation dynamics are acquired with an undersampling factor of 2, the number of k-space samples per voxel is 2. In that way, if the mono-exponential model, $A*\exp(-t/T2)$, is used to model the T2 relaxation, the number of k-space samples per voxel equals the number of parameters (A, T2) per voxel and the data acquisition is considered to be fully efficient.

In certain embodiments, the undersampling rate can be any positive integer as long as the integer is less than or equal to the largest undersampling rate (the largest integer less than K/M).

In certain embodiments, the one or more reconstructed parameters are selected from the group consisting of T1 relaxation rate, T2 relaxation rate, proton density, T2* relaxation rate, B0 field strength, B1 field strength, blood flow, apparent diffusion coefficient, and diffusion tensor. In other embodiments, the invention can be applied to any parameter mapping applications which have a parametric model that explains the underlying signal dynamics.

In certain embodiments, the reconstruction takes the aliased relaxation signal as an input and outputs the original relaxation signals.

In certain embodiments, the reconstruction step takes a similar amount of computational time per voxel as standard parametric mapping methods.

In certain embodiments, solving the equation in the reconstruction step is fulfilled by minimization of a least-squares cost function.

In certain embodiments, the least-squares cost function is:

$$\left\| I_n(m, t_l) - \sum_{r=1-\lceil \frac{R}{2} \rceil}^{\lfloor \frac{R}{2} \rfloor} w_r(t_l) s_{n-r\frac{N}{R}}(m) f(\vec{x}_{n-r\frac{N}{R}}) \right\|^2$$

wherein:

$I_n(m, t_l)$ is the aliased signal at voxel n, coil index m, and the time point $t_l$;

$w_r(\bullet)$ is the modulation function for the aliasing signal at voxel $$n - r\frac{N}{R};$$

$$s_{n-r\frac{N}{R}}(m)$$

is the coil sensitivity of the mth coil at the aliasing voxel $$n - r\frac{N}{R};$$

$f(\bullet, t_l)$ is the underlying signal model;

$$\vec{x}_{n-r\frac{N}{R}}$$

is the unknown parameter at the aliasing voxel $$n - r\frac{N}{R};$$

R is the acceleration factor;

N is the total number of lines in the phase-encoding direction; and the symbols $\lfloor \bullet \rfloor$ and $\lceil \bullet \rceil$ represent the largest integer less than and the smallest integer greater than the argument, respectively.

In certain embodiments, $f(\bullet, t_l)$ and $$\vec{x}_{n-r\frac{N}{R}}$$

are replaced by the specific physical model and parameters. For example, in T1 mapping, $$f(\cdot, t_l) = A - B\exp\left(-\frac{t_l}{T1}\right) \text{ and } \vec{x}_{n-r\frac{N}{R}} = \left[A_{n-r\frac{N}{R}}, B_{n-r\frac{N}{R}}, T1_{n-r\frac{N}{R}}\right]^T$$

where $[\ldots]^T$ represents the vector transpose. In T2 mapping, $$f(\cdot, t_l) = A\exp\left(-\frac{t_l}{T2}\right) \text{ and } \vec{x}_{n-r\frac{N}{R}} = \left[A_{n-r\frac{N}{R}}, T2_{n-r\frac{N}{R}}\right]^T.$$

In certain embodiments, the minimization of the least-squares cost function can be solved by any unconstrained optimization algorithm known in the art. In other embodiments, the minimization of the least-squares cost function can be solved using an algorithm selected from the group consisting of steepest descend, conjugate gradients, Gauss-Newton and Levenberg-Marquardt. In yet other embodiments, the minimization of the least-squares cost function can be solved using an algorithm selected from the group consisting of Gauss-Newton and Levenberg-Marquardt.

In certain embodiments, the minimization of the least-squares cost function can also be solved by dictionary-based exhaustive search methods. In short, a dictionary that stores the signal dynamics corresponding to all the combinations of reasonable parameter values in the biological tissues is established in the reconstruction workstation. With the aliased signal as an input, the reconstruction algorithm calculates the cost of all the possible combinations of aliasing signals from the dictionary based on the least-squares criterion above. The combination that leads to the minimal cost is chosen to be the optimal estimates of the corresponding signals. The parameters that generate the corresponding signals are then considered to be the solution. Compared to the classical non-linear optimization methods, exhaustive search methods nearly eliminate the possibility of local minimum; however, the exhaustive search methods are expected to take a longer reconstruction time because of dictionary building and the exhaustive searching.

In certain embodiments, the noise amplification due to the acceleration is quantified by the dynamics-factor (d-factor) in the absence of parallel imaging, or the dynamics-geometry-factor (dg-factor) in the presence of parallel imaging.

In certain embodiments, the imaging methods of the invention can be applied to medical imaging methods, such as but not limited to MRI. In other embodiments, the medical imaging methods can be adapted and configured to image one or more organs selected from the group consisting of the heart, liver, kidneys, abdomen, breast, prostate, brain, knee, and other muscularskeletal systems. In principle, the methods of the invention can be applied to any organs or tissues where standard parametric mapping provides valuable clinical information to accelerate the imaging.

In certain embodiments, the methods of the invention can be used in one or more medical imaging applications selected from, but not limited to, the group consisting of cardiac tissue characterization, detection of edema, detection of iron overload in the heart and liver, water-fat separation imaging, clinical neuralimaging, functional MRI, tumor imaging, flow mapping, ADC mapping, diffusion tensor imaging, and magnetic resonance fingerprinting.

In certain embodiments, the methods of the invention (SUPER) can be combined with other acceleration methods known in the art. In some embodiments, SUPER can be combined with parallel imaging methods, for example, SENSE. In other embodiments, SUPER can be combined with partial Fourier techniques. In other embodiments, SUPER can be combined with simultaneous multi-slice methods. Combination of SUPER with other acceleration methods known in the art allows for higher acceleration factors to be utilized.

Devices

The invention further provides devices and non-transitory computer readable media containing program instructions executable by a processor, wherein the program instructions are instructions for performing the imaging methods of the invention.

In certain embodiments the device is a MRI machine adapted and configured to utilize the methods of the invention (SUPER). In other embodiments, the device is a computer which can process data derived from an MRI machine.

Those skilled in the art will recognize, or be able to ascertain using no more than routine experimentation, numerous equivalents to the specific procedures, embodiments, claims, and examples described herein. Such equivalents were considered to be within the scope of this invention and covered by the claims appended hereto. For example, it should be understood, that modifications in equipment, compositions and/or methods with art-recognized alternatives and using no more than routine experimentation, are within the scope of the present application.

It is to be understood that, wherever values and ranges are provided herein, the description in range format is merely for convenience and brevity and should not be construed as an inflexible limitation on the scope of the invention. Accordingly, all values and ranges encompassed by these values and ranges are meant to be encompassed within the scope of the present invention. Moreover, all values that fall within these ranges, as well as the upper or lower limits of a range of values, are also contemplated by the present application. The description of a range should be considered to have specifically disclosed all the possible sub-ranges as well as individual numerical values within that range and, when appropriate, partial integers of the numerical values within ranges. For example, description of a range such as from 1 to 6 should be considered to have specifically disclosed sub-ranges such as from 1 to 3, from 1 to 4, from 1 to 5, from 2 to 4, from 2 to 6, from 3 to 6 etc., as well as individual numbers within that range, for example, 1, 2, 2.7, 3, 4, 5, 5.3, and 6. This applies regardless of the breadth of the range.

The following examples further illustrate aspects of the present invention. However, they are in no way a limitation of the teachings or disclosure of the present invention as set forth herein.

EXAMPLES

The invention is now described with reference to the following Examples. These Examples are provided for the purpose of illustration only, and the invention is not limited to these Examples, but rather encompasses all variations that are evident as a result of the teachings provided herein.
Materials and Methods All in vivo imaging was performed on a 3T scanner (Siemens Trio). All subjects provided informed consent prior to the scans. The study was reviewed and approved by the Yale University institutional review board (IRB).

Example 1: SUPER Acceleration Strategy

An exemplary acceleration strategy of SUPER and the corresponding reconstruction are illustrated in FIGS. 1A-1D. The shown method utilizes 11 T1-weighted images (FIG. 1A, top) to reconstruct 3 parameter maps: A, B, and T1 (FIG. 1A, bottom). The k-space (FIG. 1A, second from top) of the 11 T1-weighted images is uniformly undersampled with a sampling scheme called "shift undersampling", which skips k-space lines along the phase-encoding direction and shifts the undersampling pattern continuously over the multiple TIs (FIG. 1A, third from top). Examples of shift undersampling with different acceleration factors are found in FIGS. 1B-1D. Inverse Fourier transform is then applied to each k-space, after zero-filling the missing k-space lines, resulting in 11 aliased images each with a different T1 contrast and a shifted aliasing pattern (FIG. 1A, third from bottom). Due to the aliasing, each image has half of the voxels being independent, with the other half being a duplication. All the independent voxels are stacked up in the vertical direction to form a reconstruction matrix of size $N^2/2 \times 11$, where each row represents a voxel in the total of $N^2/2$ independent voxels (image size: N×N) and each column represents a sample of the aliased signal at the underlying TI (FIG. 1A, second from bottom). The last step of SUPER is a model-based voxel-by-voxel de-aliasing reconstruction, which is applied to each row of the reconstruction matrix to estimate the 3 parameters at each aliasing voxel. The parametric maps of A, B, and T1 are fully reconstructed by applying this optimization process for all independent voxels (FIG. 1A, bottom).

The purpose of shift undersampling in SUPER is to create a modulated summation of the aliasing signals so that they are distinguishable in the temporal-frequency domain. The use of shift undersampling is very important for preservation of the conditioning of the reconstruction problem. The importance is illustrated in FIGS. 2A-2B by comparing the shift undersampling strategy to static undersampling, which uses the same undersampling pattern for every image during the parametric mapping acquisition. With shift undersampling, each aliasing signal is modulated by a different frequency before the summation, which results in two distinguishable spectra in the temporal-frequency domain (FIG. 2A). With static undersampling, however, the two aliasing signals are completely overlapped with each other in the temporal-frequency domain (FIG. 2B). As the de-aliasing reconstruction comprises a separation of the two aliasing spectra, the more distinguishable spectra as a result of shift undersampling render it a favorable strategy for optimization of the reconstruction conditioning.

Example 2: SUPER Reconstruction Strategy

The reconstruction of SUPER comprises of solving an inverse problem voxel-by-voxel to estimate the underlying parameters. A derivation of the cost function for each voxel is described as follows.

Shift undersampling creates a signal that is mathematically described by:

$$I_n(t_l) = \sum_{r=1-\lceil R/2 \rceil}^{\lfloor R/2 \rfloor} w_r(t_l) O_{n-r\frac{N}{R}}(t_l) \tag{1}$$

where $\{t_l: l=0, 2, \ldots, L-1\}$ the set of control parameters (e.g. TI and TE), $w_r(t_l)$ the modulating function for each original signal, N the number of phase-encoding lines, R the reduction factor, $\lfloor \cdot \rfloor =$floor($\cdot$), $\lceil \cdot \rceil =$ceil($\cdot$), $I_n(t_l)$ the aliased signal at voxel n and the measurement $t_l$, and $$O_{n-r\frac{N}{R}}(t_l)$$

the original signal at voxel $$n - r\frac{N}{R}$$

and $t_l$. The modulating function is formulated as:

$$w_r(t_l) = \frac{1}{R} e^{\frac{2\pi i l r}{R}} \tag{2}$$

where 1 represents the imaginary unit. Notice that Equation 1 itself is ill-posed, as there are more than one signals aliasing into the measurement signal. However, the ill-posedness can be eliminated by substituting each original signal by its model with the relevant parameters:

$$I_n(t_l) = \sum_{r=1-\lceil R/2 \rceil}^{\lfloor R/2 \rfloor} w_r(t_l) f\left(\vec{x}_{n-r\frac{N}{R}}, t_l\right) \quad (3)$$

where f represents the model and $$\vec{x}_{n-r\frac{N}{R}}$$

represents the unknown set of parameters at the voxel indexed by $$n - r\frac{N}{R}.$$

In the presence of multi-channel phased array coils, Equation (3) can be rewritten as $$I_n(m, t_l) = \sum_{r=1-\lceil R/2 \rceil}^{\lfloor R/2 \rfloor} w_r(t_l) s_{n-r\frac{N}{R}}(m) f\left(\vec{x}_{n-r\frac{N}{R}}, t_l\right) \quad (4)$$

where $$s_{n-r\frac{N}{R}}(m)$$

represents the sensitivity of the mth coil at the voxel $$n - r\frac{N}{R}.$$

Equation (4) describes how the measured signal, $I_n(m,t_l)$, s related to the unknown parameters $$\vec{x}_{n-r\frac{N}{R}}$$

at all the aliasing voxels. Since f, the physical model, is typically a nonlinear function, there is no closed-form solution to Equation (4). However, the equation can be iteratively solved by minimizing the least-squares cost function associated with the equation, considering the presence of Gaussian noise in k-space:

$$\min_{\{\vec{x}_{n-r\frac{N}{R}}\}} \left\| I_n(m, t_l) - \sum_{r=1-\lceil \frac{R}{2} \rceil}^{\lfloor \frac{R}{2} \rfloor} w_r(t_l) s_{n-r\frac{N}{R}}(m) f\left(\vec{x}_{n-r\frac{N}{R}}, t_l\right) \right\|^2 \quad (5)$$

where the argument of minimization, $$\{\vec{x}_{n-r\frac{N}{R}}\}$$

refers to the set of parameters from all the aliasing voxels. In a specific application, the signal model $f(\cdot, t_l)$ and the parameter set $$\vec{x}_{n-r\frac{N}{R}}$$

should be replaced by the actual model and parameters used for the underlying application. For example, for 3-parameter T1 mapping, the specific cost function is:

$$\min_{\substack{\{A_{n-rN/R}\}, \{B_{n-rN/R}\}, \\ \{T1_{n-rN/R}\}}} \left\| I_n(m, t_l) - \sum_{r=1-\lceil \frac{R}{2} \rceil}^{\lfloor \frac{R}{2} \rfloor} w_r(t_l) s_{n-r\frac{N}{R}}(m) \left( A_{n-r\frac{N}{R}} - B_{n-r\frac{N}{R}} \exp\left(-\frac{t_l}{T1_{n-r\frac{N}{R}}}\right) \right) \right\|^2 \quad (6)$$

where the arguments $$\{A_{n-r\frac{N}{R}}\}, \{B_{n-r\frac{N}{R}}\}, \text{ and } \{T1_{n-r\frac{N}{R}}\}$$

represent the parameters from all the aliasing voxels.

Example 3: Combination of SUPER and Parallel Imaging

Parallel imaging is extensively used in clinical setting to accelerate imaging, usually by a factor of 2. The most commonly used parallel imaging methods are SENSE (Pruessmann, et al., Magn. Reson. Med. 1999; 42(5):952-62) and GRAPPA (Griswold, et al., Magn. Reson. Med. 2002; 47(6):1202-10). For example, in SENSE, k-space is undersampled in the phase-encoding direction, causing aliasing in the image domain along the same direction. The anti-aliasing process is carried out by leveraging the coil profiles to separate the original signals at each aliased voxel. The coil profile can be obtained with a separate scan, or by sampling some reference lines in the k-space center, which is later used to generate a smooth version of the coil profile. GRAPPA also entails a full sampling of k-space center and sparse sampling of peripheral k-space; however, GRAPPA uses the k-space center to fulfill an autocalibrating process whose results are used to synthesize missing lines in the peripheral k-space, which is then Fourier transformed to an aliasing-free image.

SUPER can be combined with parallel imaging to explore an acceleration factor of 4 or higher. Moreover, the combination of SUPER with SENSE is very straightforward in its reconstruction part, an advantage over many existing methods that often destroy the computational efficiency of SENSE by using non-Cartesian sampling. It's also possible to combine SUPER and GRAPPA. The coil profiles are assumed to be stationary over the time of data acquisition.

Figure 1C:
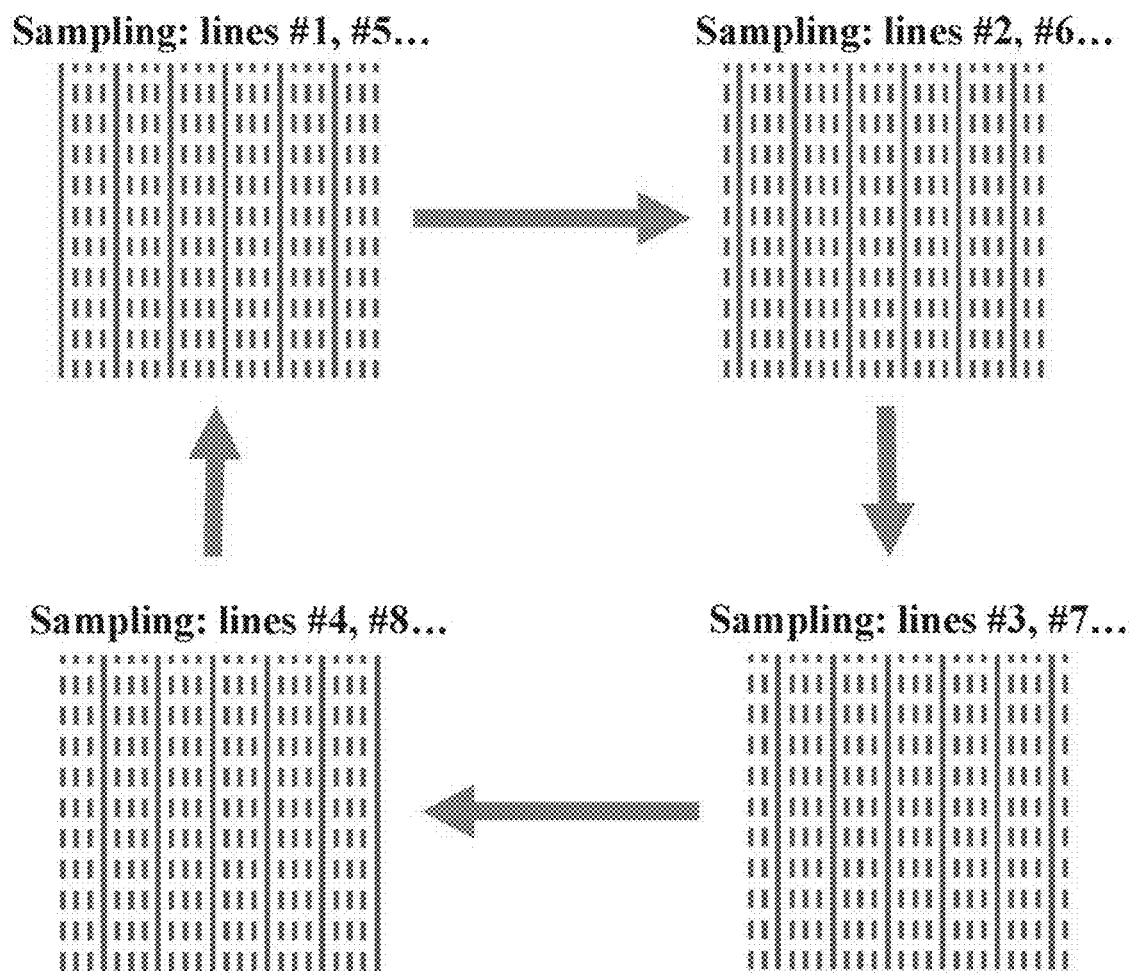

An example that combines SUPER with SENSE to accomplish a 4-fold acceleration together is described as follows. In the acquisition, k-space lines #1, #5, #9 . . . and lines #3, #7, #11 . . . are alternately sampled over the multiple TIs, as shown in FIG. 1C. All the even k-space lines are not sampled, because the missing information is compensated by the encoding due to the spatially varying coil sensitivity. Based on Equation (5), the modulation created by this undersampling pattern is:

$$w_r(t_l) = 0.25 e^{\frac{4\pi i l r}{R}} = \begin{cases} 0.25, 0.25, 0.25 \ldots \; ; & \text{if } r = 0 \text{ \& } 2 \\ 0.25, -0.25, 0.25 \ldots \; ; & \text{if } r = 1 \text{ \& } 3 \end{cases} \quad (7)$$

For the reconstruction, the modulating function is substituted into Equation (7) together with the measured coil sensitivity to estimate the parameters. The coil sensitivity can be obtained by acquiring a small number (typically 24) of low-frequency k-space lines, which is a method widely used in normal parallel imaging.

Example 4: Algorithm Optimization

Development of the optimization algorithm for Equation (5) has to be considered in a specific context, where the signal model $f(\bullet, t_l)$ and the parameters-to-estimate $$\{\vec{x}_{n-r\frac{N}{R}}\}$$

are substituted by the real model and parameters for the underlying application. Although any numerical optimization algorithm can be used to minimize the nonlinear cost function, spatial attention is needed for avoiding local minima during the optimization. An exemplary algorithm that is based on the 3-parameter T1 mapping model is described as follows.

The original cost function to minimize is given in Equation (6). The cost function is slightly reformatted to eliminate the reciprocal in the exponential term for the ease of gradient calculation:

$$\min_{\substack{\{A_{n-rN/R}\},\{B_{n-rN/R}\},\\ \{Z_{n-rN/R}\}}} \left\| I_n(m, t_l) - \sum_{r=1-\lceil\frac{R}{2}\rceil}^{\lfloor\frac{R}{2}\rfloor} w_r(t_l) s_{n-r\frac{N}{R}}(m) \left( A_{n-r\frac{N}{R}} - B_{n-r\frac{N}{R}} \exp(t_l Z_{n-r\frac{N}{R}}) \right) \right\|^2 \quad (8)$$

where $Z_{n-r\frac{N}{R}} = -1/T1_{n-rN/R}$.

Furthermore, since $$I_n(m, t_l), A_{n-r\frac{N}{R}}, \text{ and } B_{n-r\frac{N}{R}}$$

are complex-valued, a complex-valued gradient should be derived for the optimization. Alternatively, one can derive a separate gradient for the real and imaginary part of the variables. By implementing this alternative derivation, the cost function transforms to:

$$\min_{\substack{\{A^R_{n-r\frac{N}{R}}\},\{A^I_{n-r\frac{N}{R}}\},\\ \{B^R_{n-r\frac{N}{R}}\},\{B^I_{n-r\frac{N}{R}}\},\\ \{Z^R_{n-r\frac{N}{R}}\},\{Z^I_{n-r\frac{N}{R}}\}}} \left\| I_n(m, t_l) - \sum_{r=1-\lceil\frac{R}{2}\rceil}^{\lfloor\frac{R}{2}\rfloor} w_r(t_l) s_{n-r\frac{N}{R}}(m) \left( \begin{array}{c} \left(A^R_{n-r\frac{N}{R}} + \iota A^I_{n-r\frac{N}{R}}\right) - \left(B^R_{n-r\frac{N}{R}} + \iota B^I_{n-r\frac{N}{R}}\right) \\ \exp\left(t_l\left(Z^R_{n-r\frac{N}{R}} + \iota Z^I_{n-r\frac{N}{R}}\right)\right) \end{array} \right) \right\|^2 \quad (9)$$

where $A^R_{n-r\frac{N}{R}}$ and $A^I_{n-r\frac{N}{R}}$, $B^R_{n-r\frac{N}{R}}$ and $B^I_{n-r\frac{N}{R}}$, $Z^R_{n-r\frac{N}{R}}$ and $Z^I_{n-r\frac{N}{R}}$ are the real and imaginary parts of the corresponding variable, respectively. Gradient is calculated with respect to all 6 variables separately.

Direct minimization of the cost function can leave the optimization trapped in local minima. A critical step to avoid local minima is bounding variables $$Z^R_{n-r\frac{N}{R}} \text{ and } Z^I_{n-r\frac{N}{R}}$$

with physiologically meaningful values. In practice, $$Z^R_{n-r\frac{N}{R}}$$

is bounded by $[-0.01 \text{ ms}^{-1}, -0.0002 \text{ ms}^{-1}]$, which correspond to bounds of $$T1_{n-r\frac{N}{R}}$$

by [100 ms, 5000 ms]. For T1 mapping, there should not be any continuous change of phase, so $$Z^I_{n-r\frac{N}{R}}$$

should be close to 0. A variety of methods can be used to implement a bounded optimization. An exemplary regularization-based method is described as follows, which introduces auxiliary terms to enforce the bounds:

$$\min_{\{A_{n-rN/R}\},\{B_{n-rN/R}\},\{Z_{n-rN/R}\}} \left\| I_n(m, t_l) - \sum_{r=1-\lceil\frac{R}{2}\rceil}^{\lfloor\frac{R}{2}\rfloor} w_r(t_l) s_{n-r\frac{N}{R}}(m) \left( \frac{\left(A^R_{n-r\frac{N}{R}} + \iota A^I_{n-r\frac{N}{R}}\right) - \left(B^R_{n-r\frac{N}{R}} + \iota B^I_{n-r\frac{N}{R}}\right)}{\exp\left(t_l\left(Z^R_{n-r\frac{N}{R}} + \iota Z^I_{n-r\frac{N}{R}}\right)\right)} \right) \right\|^2 + \qquad (10)$$

$$\sum_{r=1-\lceil\frac{R}{2}\rceil}^{\lfloor\frac{R}{2}\rfloor} \left( \Phi\left(Z^R_{n-r\frac{N}{R}}, \lambda_1, \lambda_2, LB, HB\right) + \lambda_3 \left\|Z^I_{n-r\frac{N}{R}}\right\|^2 \right)$$

where $\lambda_1, \lambda_2, \lambda_3$ are weights of each regularization, LB and HB are the lower bound and higher bound specified by the user, and $\Phi$ $$\left(Z^R_{n-r\frac{N}{R}}, \lambda_1, \lambda_2\right)$$

is a piecewise-defined, first-order differential function:

$$\Phi\left(Z^R_{n-r\frac{N}{R}}, \lambda_1, \lambda_2\right) = \begin{cases} \lambda_1 \left\|Z^R_{n-r\frac{N}{R}} - LB\right\|^2; & \text{if } Z^R_{n-r\frac{N}{R}} < LB \\ 0; & \text{if } LB \le Z^R_{n-r\frac{N}{R}} \le HB \\ \lambda_2 \left\|Z^R_{n-r\frac{N}{R}} - HB\right\|^2; & \text{if } Z^R_{n-r\frac{N}{R}} > HB \end{cases} \qquad (11)$$

Function (11) penalizes any $$Z^R_{n-r\frac{N}{R}}$$

that is lower than LB or higher than HB with a distance-based quadratic cost. In the present implementation, $\lambda_1=2\times 10^5$; $\lambda_2=5\times 10^9$; and $\lambda_3=10^7$ generate a desired result.

Minimization of the cost function (10) can be performed with the Levenberg-Marquardt algorithm. A pseudocode for the algorithm can be found in Madsen, et al., *Methods for non-linear least squares problems*, 1999. The initialization for the three parameters, A, B, and T1 were 1, 2, and 1000 which yielded satisfactory performance. The maximal number of iterations was 300, and the algorithm was stopped when reaching the maximal number of iterations or the norm of the gradient divided by the residual of the cost function was less than $1.0\times10^{-6}$.

Example 5: Dynamics-Factor (d-Factor)

Figure 3B:
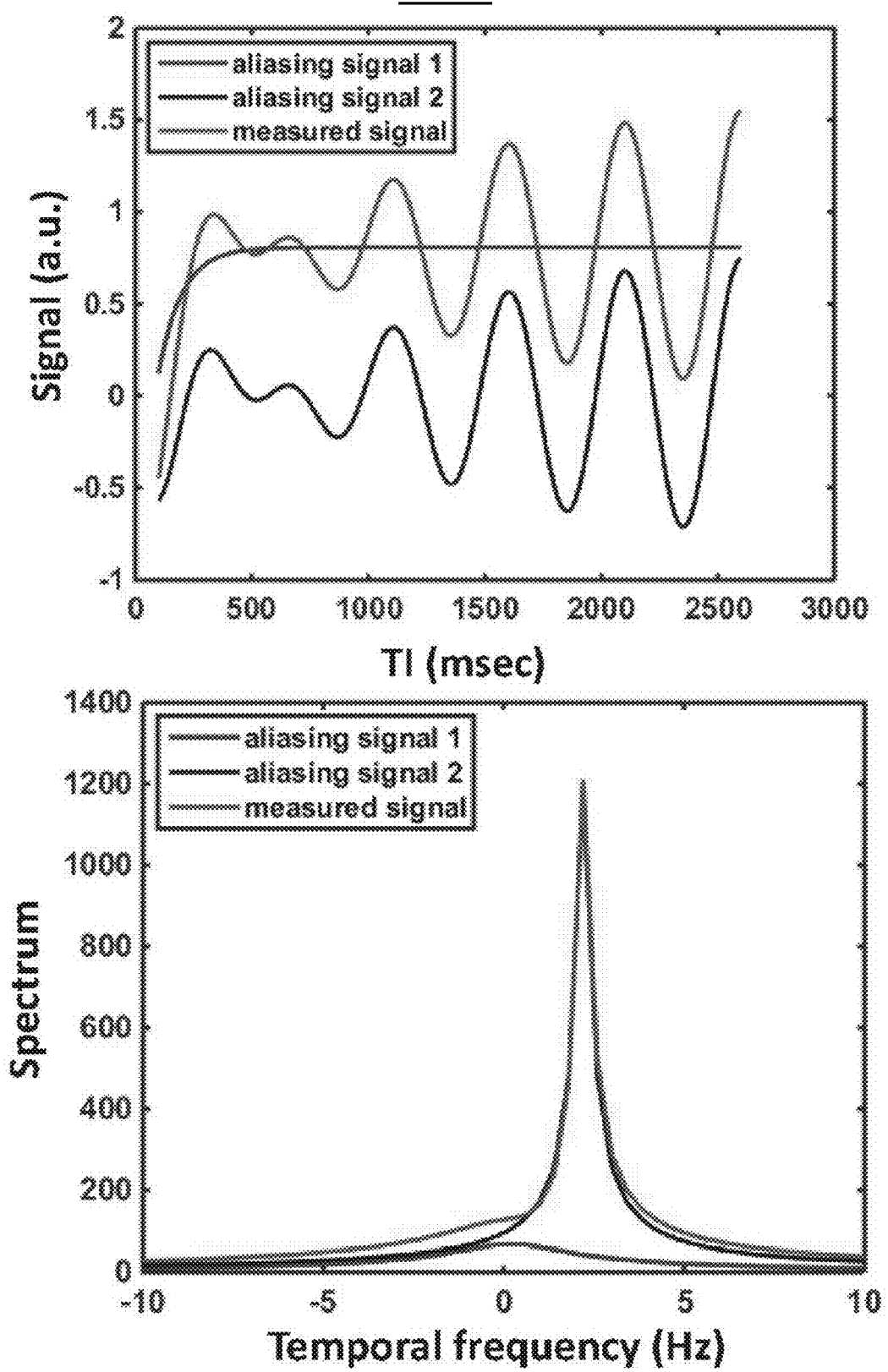

Like SENSE, noise amplification with SUPER is originated from two sources. The first source is the reduced imaging time, which is exactly the square root of the reduction factor, $\sqrt{R}$. The second factor is dependent on how rapidly each aliasing signal changes over time and thus called the dynamics-factor, or d-factor. A rapidly changing signal corresponds to a wider spectrum in the temporal frequency domain, increasing the aliasing with the other spectra. This is illustrated by a T1 mapping example in FIGS. 3A-3B. This greater aliasing in turn causes a poor conditioning for the de-aliasing reconstruction and reduces the precision of the T1 estimation. The d-factor should be considered with respect to the density of TI in the case of T1 mapping, or the density of the control parameters for a general PM task. A denser set of TI values would increase the modulation frequency, which helps with separating the spectra from each other. The increase of noise standard deviation is a product of the two factors:

$$\frac{SD(R)_{(r,\rho)}}{SD(1)_{(r,\rho)}} = d_{(r,\rho)}\sqrt{R} \qquad (12)$$

where SD(R) is the noise standard deviation of the underlying parameter under a reduction factor of R, the composite subscript $(r, \rho)$ represents the rth aliasing voxel and pth parameter (e.g., $\rho=1, 2, 3$ corresponding to A, B, and T1 in the 3-parameter T1 model), respectively, and d represents the corresponding d-factor. Unlike the g-factor in SENSE, an accurate analytical expression for the d-factor is difficult to derive due to the nonlinearity of the physical model. However, a Cramer Rao Lower Bound (CRLB) can be used to approximate the noise amplification and generate an approximated d-factor:

$$CRLB(R)_{(r,\rho)} = \frac{\sigma\sqrt{[(J^H J)^{-1}]_{(r,\rho),(r,\rho)}}}{\sqrt{R}} \qquad (13a)$$

$$d_{(r,\rho)} \approx \frac{CRLB(R)_{(r,\rho)}}{CRLB(1)_{(r,\rho)}\sqrt{R}} = \sqrt{[(J^H J)^{-1}]_{(r,\rho),(r,\rho)}(J^H J)_{(r,\rho),(r,\rho)}} \qquad (13b)$$

where CRLB(R) is the CRLB of the underlying parameter for an acceleration factor of R, $\sigma$ the noise standard deviation at each voxel, H the matrix conjugate transpose, $(r, \rho)$, $(r, \rho)$ an index for a diagonal element of a matrix corresponding to the parameter indexed by $(r, \rho)$, and J is the $L\times RP$ Jacobian matrix associated with the nonlinear forward operator in Equation (5). For the 3-parameter T1 mapping, J can be explicitly written as $$J_{l,(r,\rho)} = \begin{cases} w_r(t_l) & \text{if } \rho = 1 \\ -w_r(t_l)\exp\left(-\frac{t_l}{T1_{n-r\frac{N}{R}}}\right); & \text{if } \rho = 2 \\ -w_r(t_l)B_{n-r\frac{N}{R}}\frac{t_l}{T1^2_{n-r\frac{N}{R}}}\exp\left(-\frac{t_l}{T1_{n-r\frac{N}{R}}}\right); & \text{if } \rho = 3 \end{cases} \quad (14)$$

where $\rho=1, 2, 3$ correspond to A, B, and T1 in the 3-parameter T1 model, respectively. In the presence of multi-coils, noise amplification is based on both the dynamics-factor and geometry-factor, thus called dynamics-geometry-factor or dg-factor, which is calculated based on the same formula in Equation 13b but with a different Jacobian matrix that involves coil sensitivity:

$$J_{(l,m),(r,\rho)} = \qquad (15)$$
$$\begin{cases} w_r(t_l)s_{n-r\frac{N}{R}}(m); & \text{if } \rho = 1 \\ -w_r(t_l)s_{n-r\frac{N}{R}}(m)\exp\left(-\frac{t_l}{T1_{n-r\frac{N}{R}}}\right); & \text{if } \rho = 2 \\ -w_r(t_l)s_{n-r\frac{N}{R}}(m)B_{n-r\frac{N}{R}}\frac{t_l}{T1^2_{n-r\frac{N}{R}}}\exp\left(-\frac{t_l}{T1_{n-r\frac{N}{R}}}\right); & \text{if } \rho = 3 \end{cases}$$

Example 6: Artifacts

In SUPER, inaccurate modeling of the signal at a voxel may cause a bias in all aliasing voxels, causing aliasing artifacts in the reconstructed parameter map. Potential factors that may cause error in the signal modeling include motion, partial volume, and underrepresented effects such as J-coupling in the fat tissue. Model inaccuracy due to these reasons may be found based on the residual of the optimization at each voxel.

Example 7: Initial Simulations without Dynamics Factor

Simulations were performed to investigate the accuracy and precision of SUPER T1 and T2 mapping with different acceleration factors. In these simulations, d-factors were not calculated or applied. Three acceleration factors, 1 (no acceleration), 2, and 4, were tested for both T1 and T2 mapping. For the acceleration factor of 1, 4000 randomly generated T1 and T2 values were employed to generate the T1 and T2 relaxation signal, respectively. The random T1 generator satisfies a uniform distribution between 200 ms and 2000 ms, and the random T2 generator satisfies a uniform distribution between 10 ms and 200 ms. For T1 relaxation, we used a 3-parameter model A−B*exp(−TI/T1), where A, B were also randomly generated, with modulus of A fixed to be 1. Twelve TIs—100, 200, 400, 800, 1200, 1600, 2000:500:4500—were used in the simulation. For T2 relaxation, we used a 2-parameter model A*exp(−TE/T2), where A was also randomly generated with modulus fixed to be 1. Eight TEs—0, 10, 20, 30, 50, 80, 120, 180—were used in the simulation. The resultant relaxation signal was fit to the standard voxel-by-voxel curve fitting method for T1 and T2 relaxation to estimate parameters A, B, T1 for T1 relaxation, and A, T2 for T2 relaxation, respectively.

For acceleration factor=2 (SUPER 2), 8000 randomly generated T1 and T2 values were employed to generate 4000 T1 and T2 relaxation signal pairs, respectively. The choice of T1, T2, and other parameters, including A, B, TI, and TE, used the same method as in the previous case. The two relaxation signals from each pair of voxels were modulated and combined, as described by Equation (1). The aliased signal was input to the SUPER reconstruction to estimate T1 (or T2) from the two voxels.

For acceleration factor=4 (SUPER 4), 16000 T1 and T2 values were randomly generated and grouped to 4000 subgroups, each including 4 T1s or T2s. The 4 signals within each subgroup were modulated and combined according to Equation (1). The aliased signal was input to the SUPER reconstruction to jointly estimate the 4 T1 or T2 values for each subgroup.

Three noise levels—noiseless, SNR=400, and SNR=100—were simulated for each case of the acceleration factor. Here SNR is defined as the proton density (1 in this simulation) divided by the noise standard deviation; therefore, SNR=100 is normal. For every fit, four measurements were made to evaluate the performance of the fit. The first measurement was the relative bias, defined by (estimate of T1(T2)−true T1(T2))/true T1(T2). The second measurement was the residual of the cost function of each fit, normalized by the $l_2$-norm of the signal. The third and fourth measurement were the number of iterations of the optimization algorithm and the computational time per voxel for the optimization. The computational time per voxel is calculated by dividing the total computational time by the factor of acceleration. A Levenberg-Marquardt algorithm was implemented using MATLAB to fulfill the optimization in this and all following example.

Table 1 and Table 2 show the simulation results of SUPER T1 mapping and T2 mapping, respectively. Notice that all numbers related to "bias" (3rd column) are relative, i.e. they are defined as the bias of the T1 or T2 estimate divided by the actual T1 and T2 values. The results show that SUPER is highly accurate, as the worst-case accuracy—when 4-fold acceleration is used with SNR=100—is 0.013 and 0.002, for T1 and T2 mapping, respectively. SUPER is very precise with 2-fold acceleration, where the standard deviation of T1 and T2 bias was 0.079 and 0.02, respectively, at SNR=100. Comparing to the acceleration-free T1 and T2 mapping whose standard deviations are 0.08 and 0.014, SUPER excellently preserves the precision. At 4-fold acceleration, SNR=100, the standard deviation of T1 and T2 bias was 0.28 and 0.16. Since 4-fold acceleration means a full efficiency for the acquisition, we infer the precision of SUPER at full efficiency is suboptimal. The algorithm used by SUPER always led to a similar residual comparing to standard voxel-by-voxel curve fitting, suggesting that the reconstruction algorithm is reliable in achieving convergence. In terms of computational efficiency, despite the increase of acceleration factor, SUPER reconstruction does not have dramatically increased number of iterations, and the computational time per voxel is decreasing. This suggests that SUPER is even faster than the standard voxel-by-voxel curve fitting. This speed advantage is not influenced by level of SNR.

TABLE 1

Reconstruction of SUPER T1 mapping with different proton-density SNRs and different acceleration factors

| Acceleration Factor | Proton-Density SNR | Bias | Residual | No. of Iterations | Computation time per voxel |
|---|---|---|---|---|---|
| 1 | Noiseless | 7.22e−10 ± 2.24e−8 | 6.91e−18 ± 1.14e−16 | 5.04 ± 0.94 | 3.1 ms ± 2.2 ms |
|   | 400 | −2.21e−4 ± 0.010 | 1.77e−5 ± 1.70e−5 | 5.59 ± 0.92 | 3.5 ms ± 2.3 ms |
|   | 100 | 3.5e−3 ± 0.08 | 2.82e−4 ± 2.71e−4 | 6.34 ± 1.35 | 4.1 ms ± 2.7 ms |
| 2 | Noiseless | 5.04e−10 ± 3.91e−8 | 3.55e−18 ± 1.26e−16 | 5.46 ± 0.77 | 2.1 ms ± 1.2 ms |
|   | 400 | 8.49e−5 ± 0.016 | 8.77e−6 ± 6.51e−6 | 6.11 ± 0.92 | 2.2 ms ± 1.4 ms |
|   | 100 | 3.4e−3 ± 0.12 | 1.37e−4 ± 9.95e−5 | 7.10 ± 1.29 | 2.7 ms ± 1.5 ms |
| 4 | Noiseless | 1.82e−8 ± 2.07e−7 | 8.55e−18 ± 4.36e−17 | 6.55 ± 2.36 | 1.7 ms ± 2.0 ms |
|   | 400 | 1.6e−3 ± 0.098 | 1.59e−6 ± 1.43e−6 | 7.54 ± 4.82 | 2.0 ms ± 4.8 ms |
|   | 100 | 0.013 ± 0.24 | 2.59e−5 ± 2.41e−5 | 10.19 ± 9.11 | 2.8 ms ± 7.5 ms |

TABLE 2

Reconstruction of SUPER T2 mapping with different proton-density SNRs and different acceleration factors

| Acceleration Factor | Proton-Density SNR | Bias | Residual | No. of Iterations | Computation time per voxel |
|---|---|---|---|---|---|
| 1 | Noiseless | 8.01e−10 ± 2.07e−9 | 6.47e−18 ± 3.52e−17 | 5.84 ± 1.35 | 4.2 ms ± 3.6 ms |
|   | 400 | −6.54e−5 ± 3.3e−3 | 1.07e−4 ± 1.59e−4 | 5.97 ± 1.27 | 4.5 ms ± 3.5 ms |
|   | 100 | −1.25e−4 ± 0.014 | 1.7e−3 ± 2.5e−3 | 6.46 ± 1.32 | 4.5 ms ± 3.4 ms |
| 2 | Noiseless | 1.25e−9 ± 7.31e−9 | 2.39e−17 ± 2.04e−16 | 6.37 ± 1.46 | 3.0 ms ± 2.0 ms |
|   | 400 | 4.06e−5 ± 4.8e−3 | 4.69e−5 ± 6.92e−5 | 6.86 ± 1.44 | 3.2 ms ± 2.0 ms |
|   | 100 | 2.79e−4 ± 0.02 | 7.79e−4 ± 1.0e−3 | 7.44 ± 1.34 | 3.5 ms ± 2.4 ms |
| 4 | Noiseless | 2.1e−3 ± 0.14 | 0.0020 ± 0.036 | 8.25 ± 10.01 | 3.3 ms ± 13.3 ms |
|   | 400 | 3.8e−3 ± 0.17 | 0.0026 ± 0.042 | 9.02 ± 11.46 | 3.6 ms ± 15.5 ms |
|   | 100 | 2.2e−3 ± 0.16 | 2.1e−3 ± 0.036 | 9.56 ± 9.94 | 3.7 ms ± 16.2 ms |

Example 8: Simulations with Dynamics Factor

Monte-Carlo simulations were employed to assess the performance of SUPER and CRLB-based d-factor calculation. Sixty thousand T1 relaxation signals were synthesized based on the model A−B*exp(−t/T1) with A, B, and T1 uniformly distributed in [1, 5], [1.8 A, 2 A], and [200 ms, 2000 ms], respectively. Twelve TI values were used to provide accelerations up to 4-fold, including TI=100 ms, 200 ms, 400 ms, 800 ms, 1200 ms, 1600 ms, 2000 ms, 2500 ms, 3000 ms, 4000 ms, 6000 ms, and 10000 ms. Note that a reduction of 4 reached the maximal acceleration for 12 TIs and 3 parameters. Furthermore, there were 6 noise standard deviation ranging from 0 to 0.04. For each reduction factor R, the 60000 signals were grouped into 60000/R subsets to synthesize the aliased signal based on Equation 2. The reconstruction was applied to each aliased signal. The accuracy and precision of the T1 estimate were based on the mean and standard deviation of the T1 estimation bias divided by the underlying T1 over the 60000 signals, respectively. CRLB and the approximated d-factor for the noise amplification were calculated. The computational time was recorded for all reconstructions.

Figure 4A:
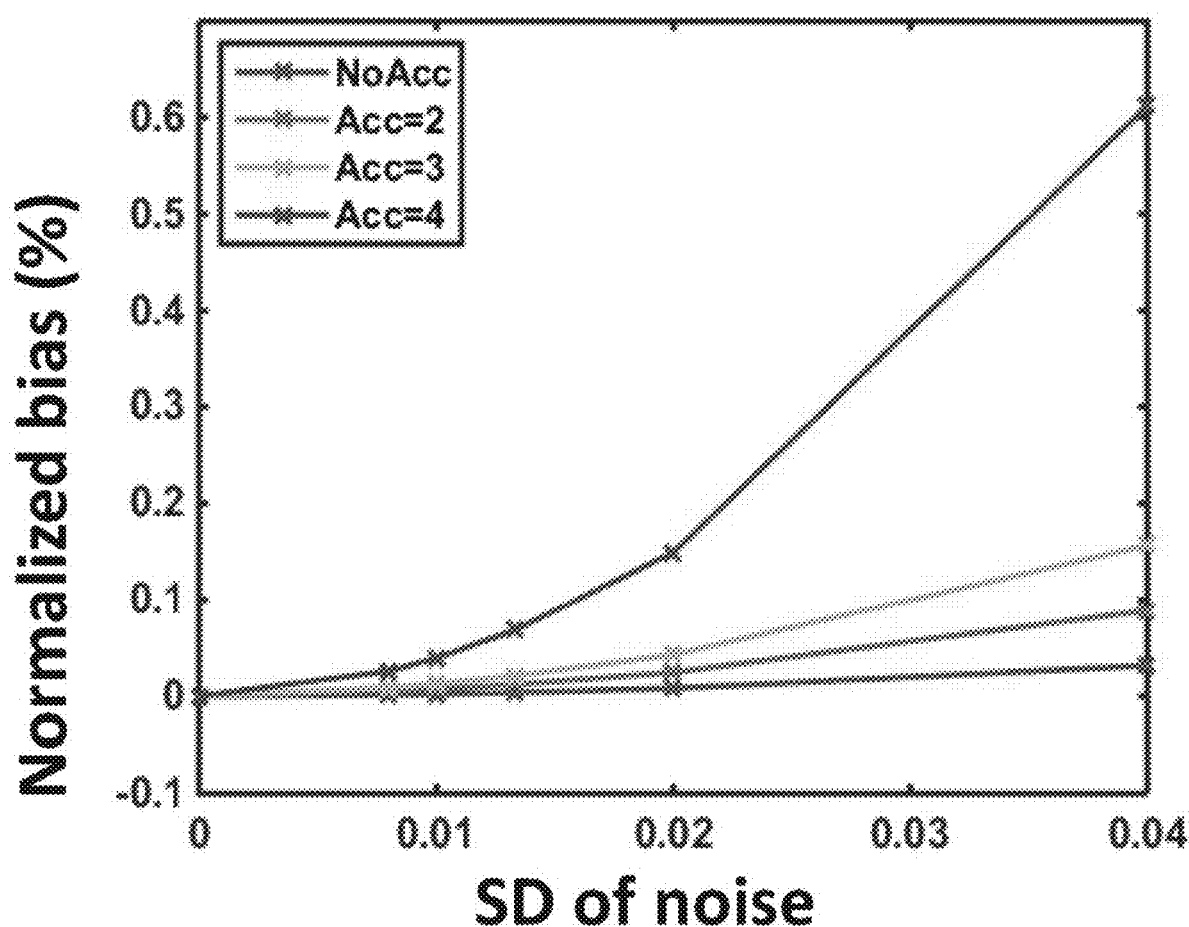
Figure 4B:
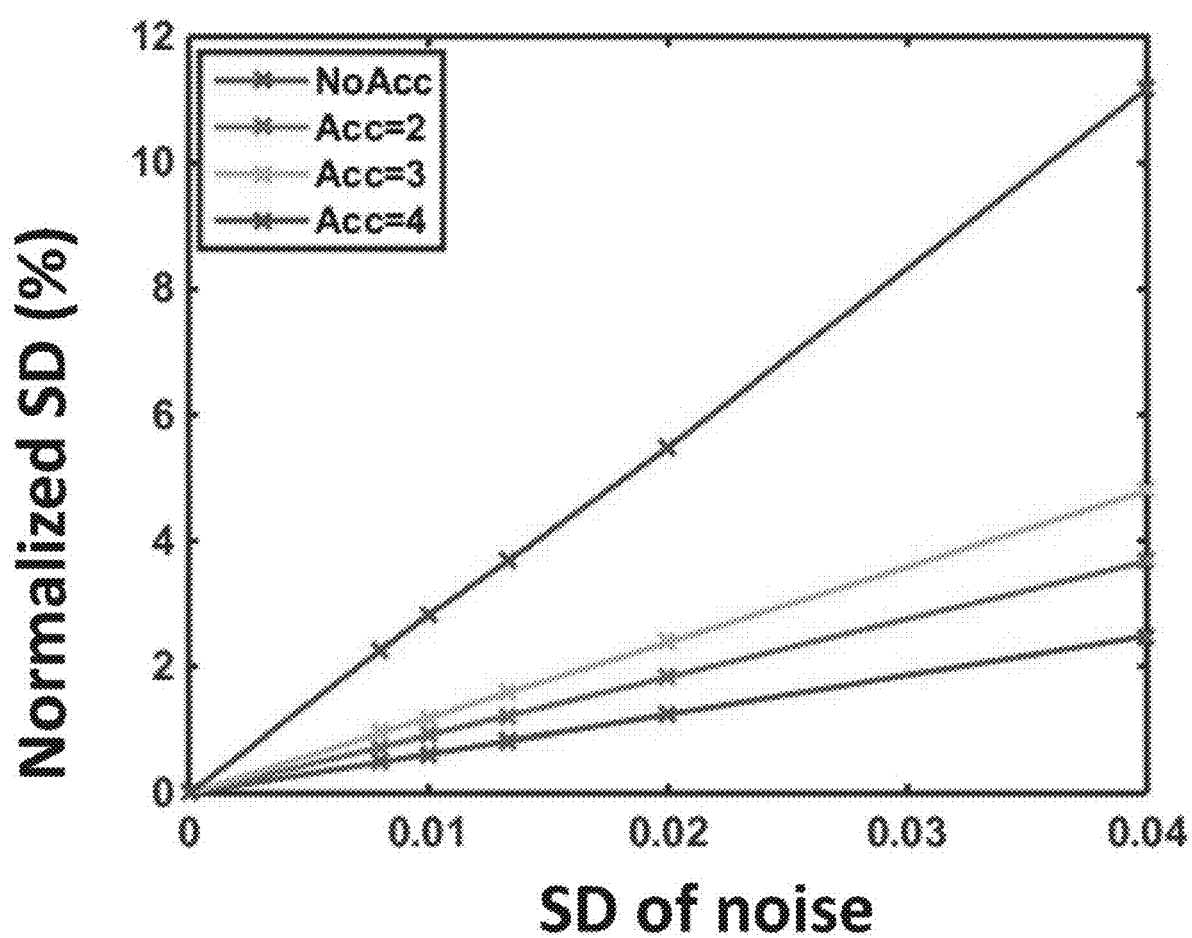
Figure 4D:
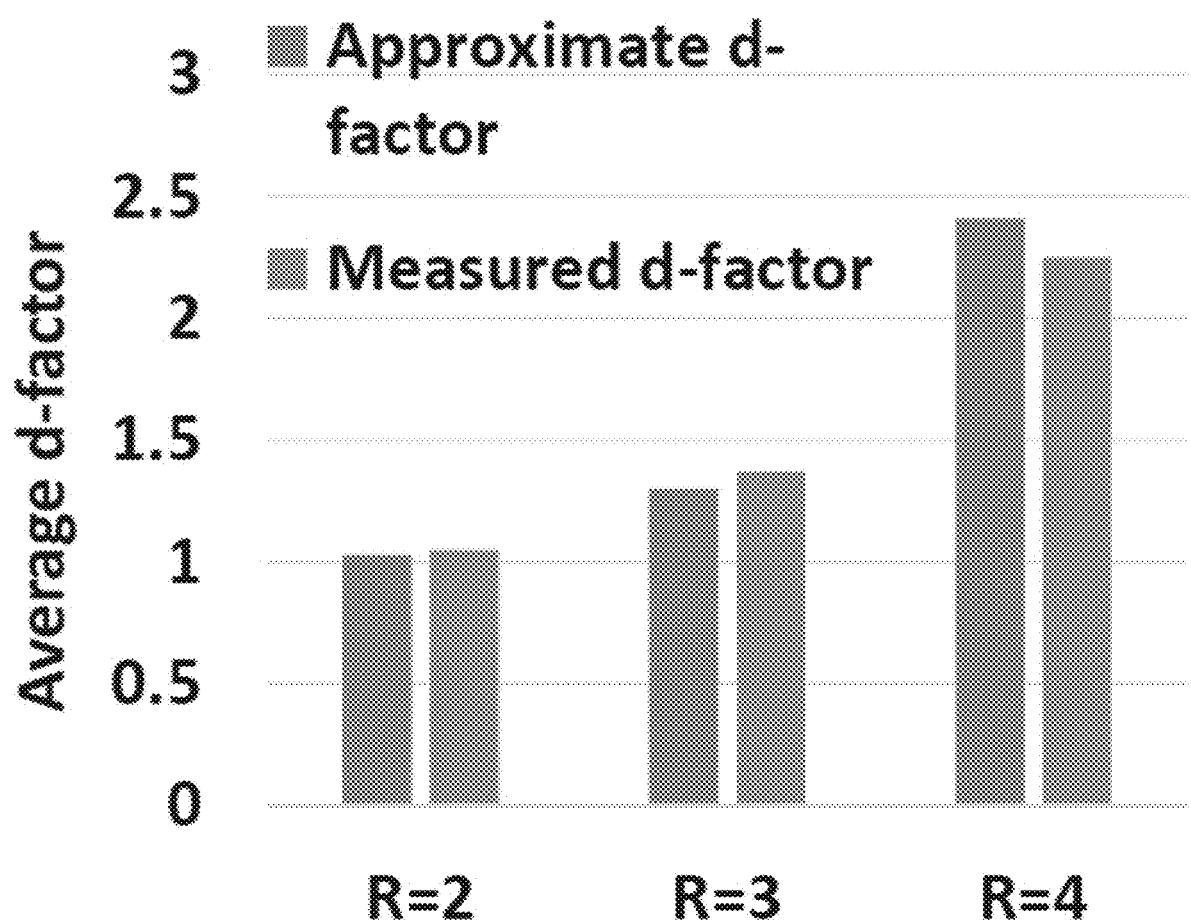
FIG. 4D shows the comparison between the measured d-factor, calculated based on Equation 12, and the approximate d-factor, calculated based on Equation 13b.

FIGS. 4A-4D show the accuracy, precision, and d-factor associated with SUPER accelerations of R=2, 3, and 4, obtained from 60000 voxels with random parameters. The normalized bias (absolute value of difference between mean of T1 estimate and the true value divided by the true value) and the normalized standard deviation (standard deviation of T1 estimate divided by the true value) of SUPER T1 estimate were shown in FIGS. 4A-4B. SUPER achieved an excellent accuracy with the maximal bias of 0.6% among all noise levels and accelerations. The normalized standard deviation (SD) increased linearly with the SD of noise to the maximum of 12% at a noise SD of 0.04. This linearity was consistent with the CRLB-based estimation of the noise SD, which was shown in FIG. 4C and was very close to the normalized SD. FIG. 4D shows the comparison between the average of the measured d-factor, calculated based on Equation 9, and the average of the approximate d-factor, calculated based on Equation 10b. They matched each other excellently.

Figure 5C:
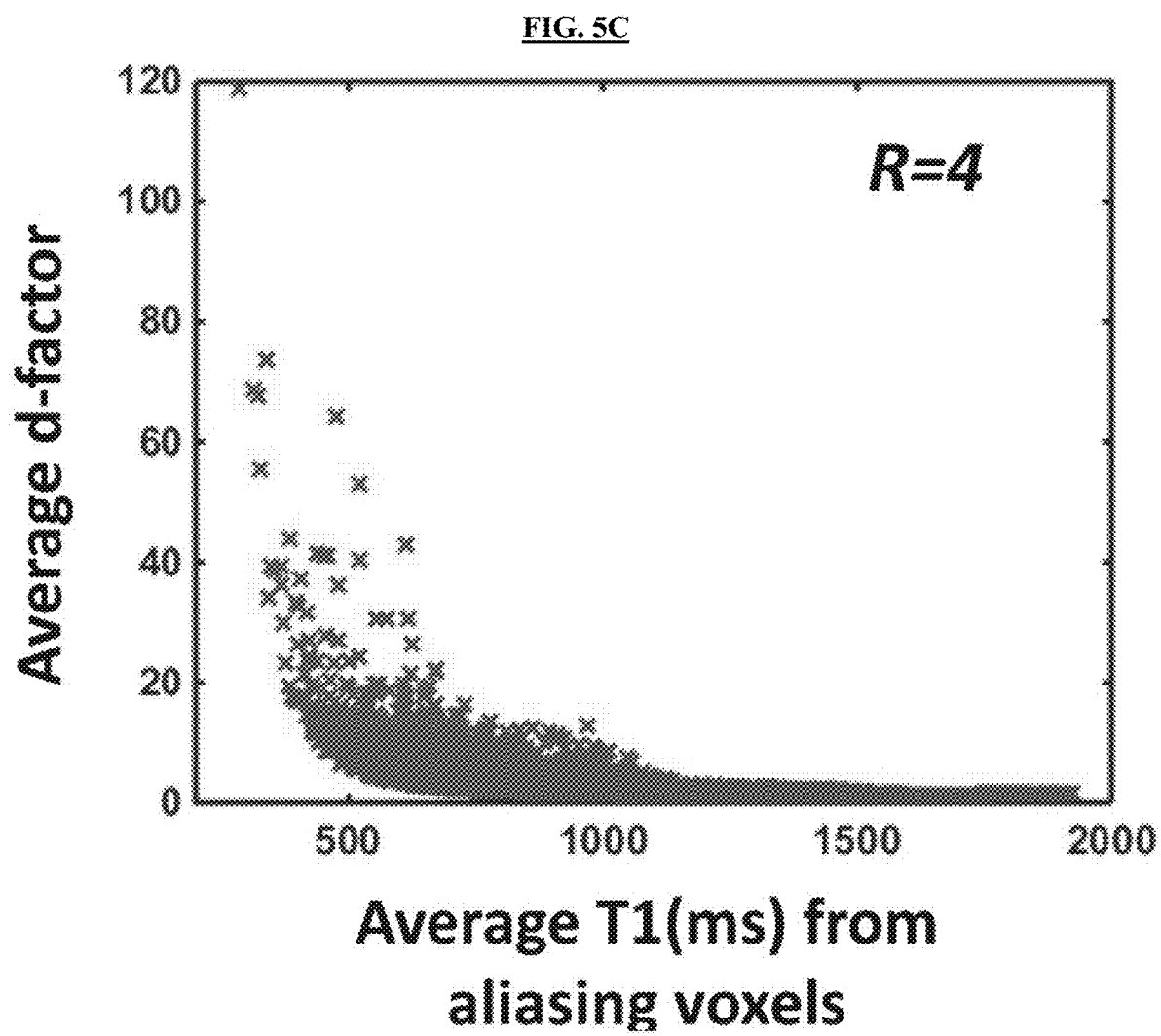
Figure 5D:
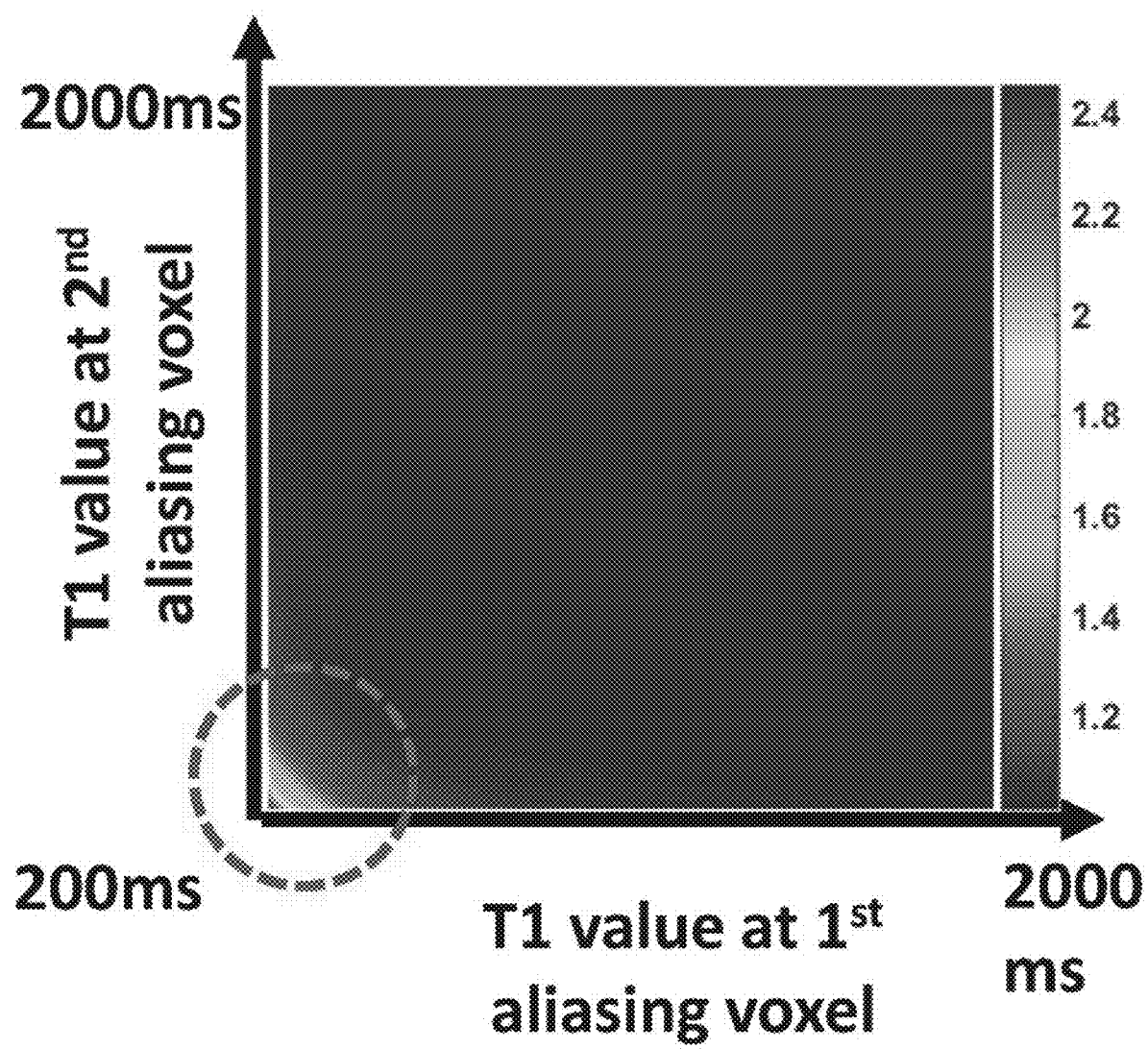
FIG. 5D shows the relationship between the average d-factor and the pair of T1s from the two aliasing voxels for a twofold acceleration. The red circle highlights the increase of d-factor in the region of short T1s from both voxels.

FIGS. 5A-5D show the T1-dependency of d-factors. FIGS. 5A-5C plot the average d-factor versus the average T1 over the aliasing voxels for R=2, 3, and 4. Lower T1 values consistently led to higher d-factors. A slight rise of d-factor was also seen with very large T1 values, which was probably due to the insufficient TI coverage of the signal dynamics associated with these large T1s. FIG. 5D shows more detail about the T1-dependency, using a surface plot of the d-factor at R=2 with respect to the T1 values in the $1^{st}$ and $2^{nd}$ voxel. The increased d-factor was mainly seen in the bottom-left corner (FIG. 5D, circled) which corresponded to low T1s for both voxels.

Table 3 shows the number of iterations and the computational time per voxel for different accelerations. Although the number of iterations for SUPER increased with a higher acceleration level, the number of iterations per voxel was actually reduced, noting that there are less independent voxels to evaluate at a higher acceleration. Similarly, the computational time per voxel also dropped with a higher acceleration.

TABLE 3

Number of iterations and computational time per voxel
for SUPER with difference accelerate rate

| Per Voxel | R = 1 (Non-Acc.) | R = 2 | R = 3 | R = 4 |
|---|---|---|---|---|
| Number of iterations | 6.3 ± 1.3 | 3.5 ± 0.6 | 2.6 ± 0.4 | 2.2 ± 1.9 |
| Computational time | 4.5 ms ± 3.2 ms | 2.9 ms ± 1.8 ms | 2.2 ms ± 1.3 ms | 2.0 ms ± 0.8 ms |

Example 9: Phantoms

A set of phantom imaging experiments was conducted using Gadolinium-doped solutions and Nickel-doped agar gel. Fourteen vials filled with Gadolinium-doped water or a mixed solution of $NiCl_2$ and agar gel were prepared with T1 values ranging from 200 ms to 1700 ms. Imaging was performed in a 3T scanner (Siemens Trio, Erlangen, Germany) using a 12-channel head coil. An inversion recovery turbo spin-echo (TSE) sequence was performed 7 times, with an increasing TI of 100 ms, 200 ms, 400 ms, 800 ms, 1600 ms, 3200 ms, and 6400 ms. Other parameters were: FOV=280 mm×140 mm, image size=192×96, TR=7000 ms, TE=4.9 ms, slice thickness=5 mm, echo train length (ETL)=12, and bandwidth=789 Hz/pixel. T1 mapping was performed using the 3-parameter model $(A-B*exp(-t/T1))$ with four sampling schemes: full-sampling, SENSE (R=2), SUPER (R=2), and their combination SENSE+SUPER (R=4). Coil mapping was performed using the TSE image at TI=6400 ms with the method in (42). Regions of interest (ROI) were drawn in each vial to obtain the mean and standard deviation of T1 estimates for each method. Noise amplification factors, including the d-factor, g-factor, and dg-factor, were calculated for the corresponding method.

Figure 6:
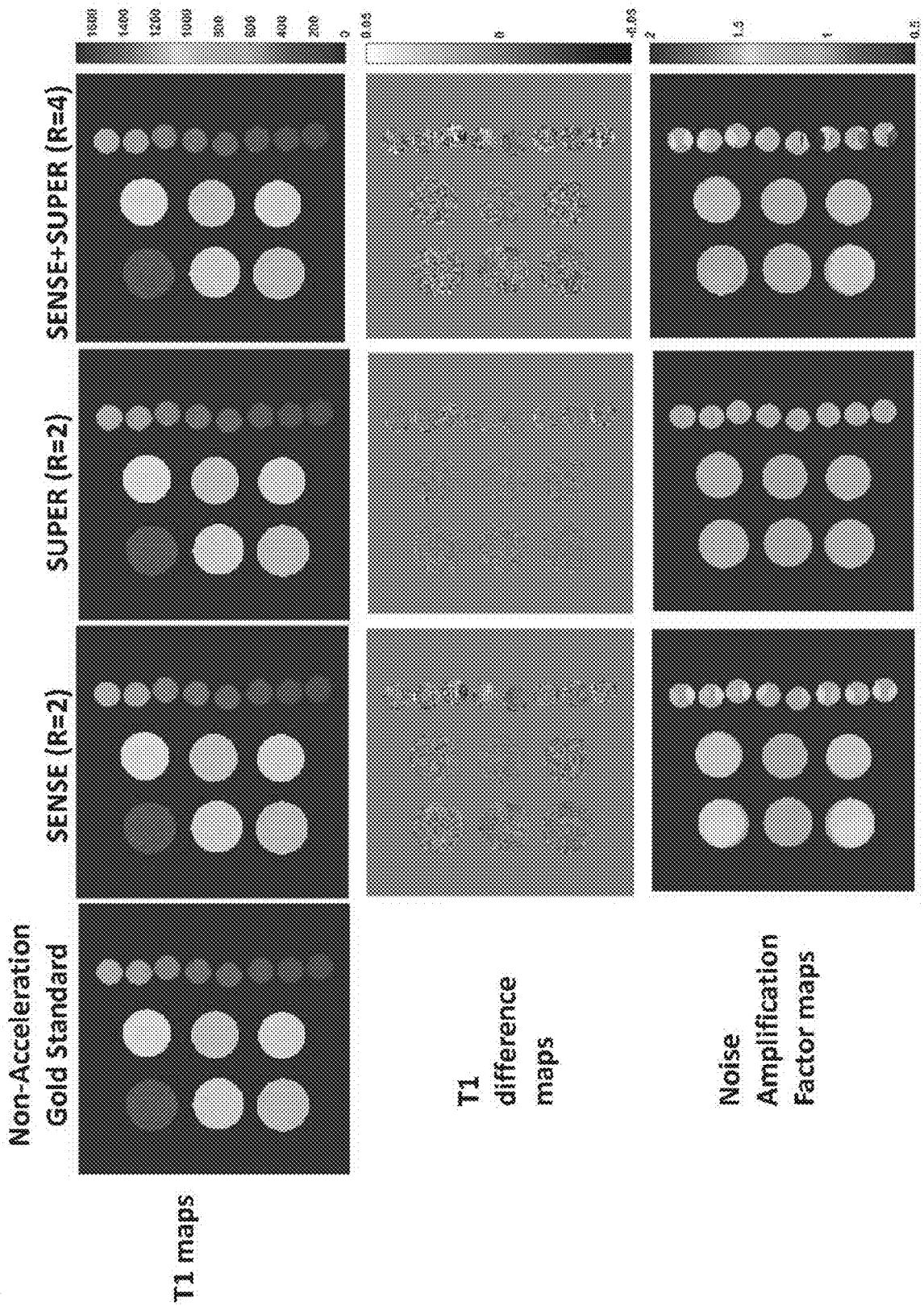
FIG. 6 shows phantom T1 maps from fully-sampled k-space (gold standard), SENSE acceleration (2-fold undersampling), SUPER acceleration (2-fold undersampling), and SUPER+SENSE acceleration (4-fold undersampling) (top row), the difference T1 maps between the 3 accelerated T1 mapping methods and the gold standard (middle row) and the noise amplification factor maps for SENSE (g-factor), SUPER (d-factor), and SENSE+SUPER (gd-factor) (bottom row).
Figure 7B:
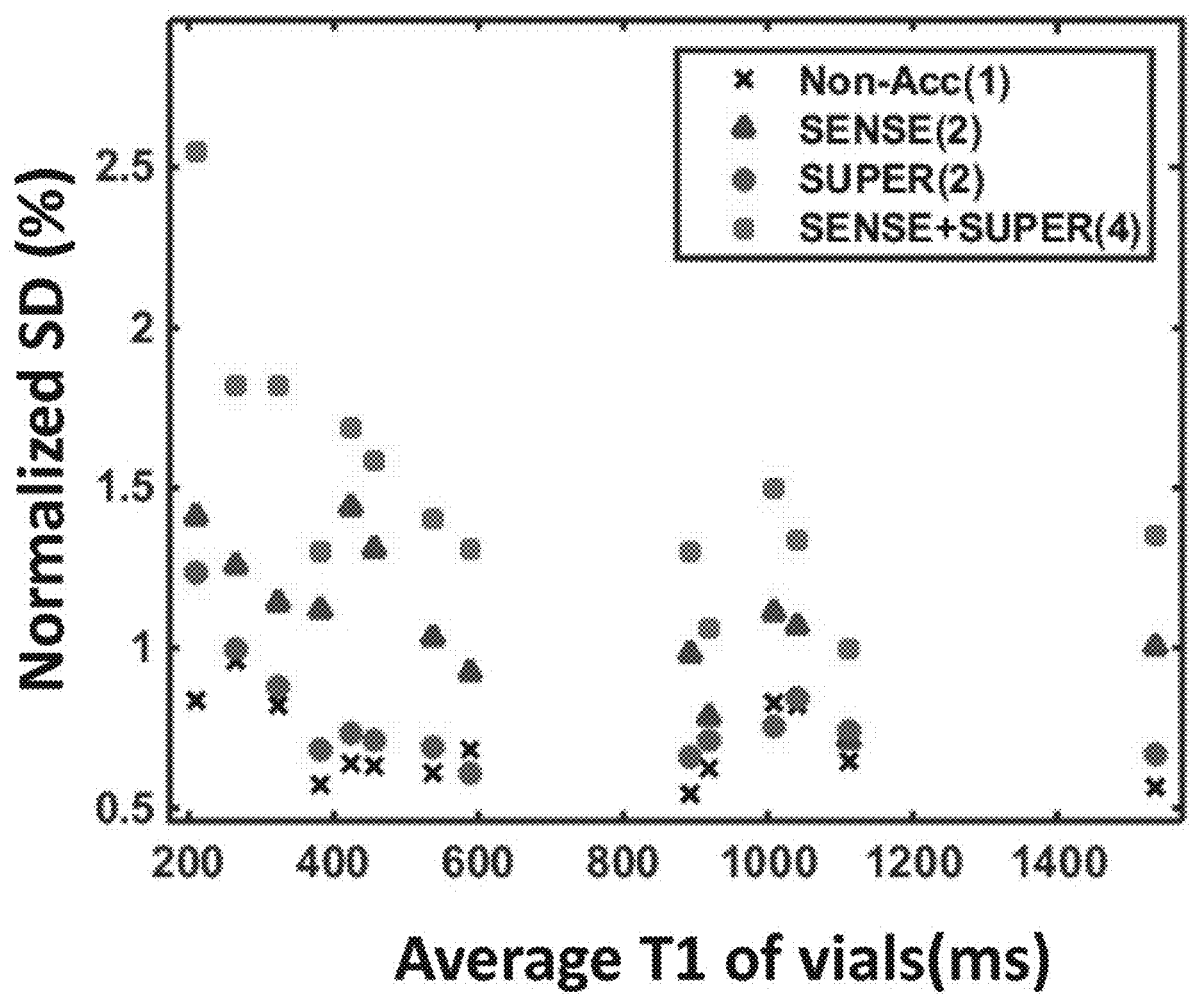

FIG. 6 shows the T1 maps from the phantom study (top row), the difference between the accelerated T1 maps and the non-accelerated T1 map (middle row), and the noise amplification factor (NAF) maps for different acceleration methods (bottom row). Visual inspection shows that all 3 acceleration methods were able to accurately reconstruct the T1 map over a wide range of T1. The precision based on the T1-difference maps was lower along the order of SUPER, SENSE, and SENSE+SUPER. This result was supported by the NAF maps, where d-factor for SUPER was lower than the g-factor for SENSE and both were lower than the dg-factor. FIGS. 7A-7B show the ROI-based measurement of the accuracy (left) and precision (right) for these T1 mapping methods. The mean of normalized bias over all vials was 0.05%, 0.3%, and 0.3% for SUPER, SENSE, and SENSE+SUPER, respectively. SUPER achieved a better accuracy compared to SENSE (p=0.01) and SENSE+SUPER (p=0.007). SENSE and SENSE+SUPER had a similar accuracy (p=0.91). The mean of normalized SD over all vials was 0.7%, 0.8%, 1.1%, and 1.5% for non-acceleration, SUPER, SENSE, and SENSE+SUPER, respectively. SUPER achieved significantly better precision that SENSE (p<0.001) despite the same acceleration rate.

Example 10: Initial In Vivo Imaging Using the Methods of the Invention

Preliminary T1 and T2 mapping were used in order to conduct accelerated cardiac and brain imaging, without calculation of d-factors.

Cardiac T1 Mapping

The most commonly used cardiac T1 mapping technique is MOLLI (Messroghli, et al., Magn. Reson. Med. 2004; 52(1):141-6). MOLLI uses a single-shot inversion recovery Balanced Steady-State Free Precession (bSSFP) readout to acquire 11 images in 17 heartbeats within a single breath-hold of the subject. The sequence timing follows so-called 3(3)3(3)5 scheme, where data is acquired only in heartbeats 1-3, 7-9, and 13-17, leaving 3 idle heartbeats between each two adjacent acquisitions to allow for sufficient signal recovery. At each acquisition heartbeat, a single image is acquired with a unique TI, resulting in 11 different TIs in the final dataset. Due to the single-shot, MOLLI is prone to having a low spatial resolution. In practice, parallel imaging is always used to improve the resolution. The standard MOLLI protocol allows an image size of 192×144 with usage of parallel imaging.

SUPER can be applied to MOLLI to reduce the data acquisition time for each readout or to increase spatial resolution given the same readout time. A shorter readout time may be helpful for patients with high heart rate, such as ventricular tachycardia patients. A higher spatial resolution can benefit imaging related to thin structures, such as right ventricle (RV) and left atrium (LA), and facilitates a better depiction of left ventricular wall. In this work, we first show the feasibility of SUPER-MOLLI, and then demonstrate the potential of higher resolution MOLLI by jointly using SUPER and parallel imaging.

MOLLI (image size: 160×84) was firstly performed without using parallel imaging. Standard voxel-by-voxel curve fitting was firstly used to generate a T1 map. Then, k-space was undersampled by a factor of 2, zero-filled, and then reconstructed by SUPER. The T1 map from 2-fold SUPER was visually compared to the original T1 map generated based on a complete sampling of k-space.

Accelerated MOLLI acquisitions (image size: 192×144) with SENSE and SUPER (acceleration factor for both: 2) were separately performed and compared in terms of image quality. Finally, we performed high resolution MOLLI (image size: 256×192), with joint SENSE-SUPER at an acceleration factor of 4.

FIGS. 8A-8B show a representative low-resolution MOLLI T1 map and the SUPER-MOLLI T1 map with 2-fold acceleration. The agreement between the two T1 maps was excellent. The average T1 of myocardium and blood was 1139 ms±73 ms and 1692 ms±49 ms for MOLLI, and 1117 ms±71 ms and 1688 ms±55 ms for SUPER-MOLLI, respectively.

FIG. 9A-9B show a representative standard-resolution MOLLI T1 map reconstructed by SENSE and SUPER, both with a 2-fold acceleration. The two T1 maps agree well with each other.

Figures 10A, 10B:
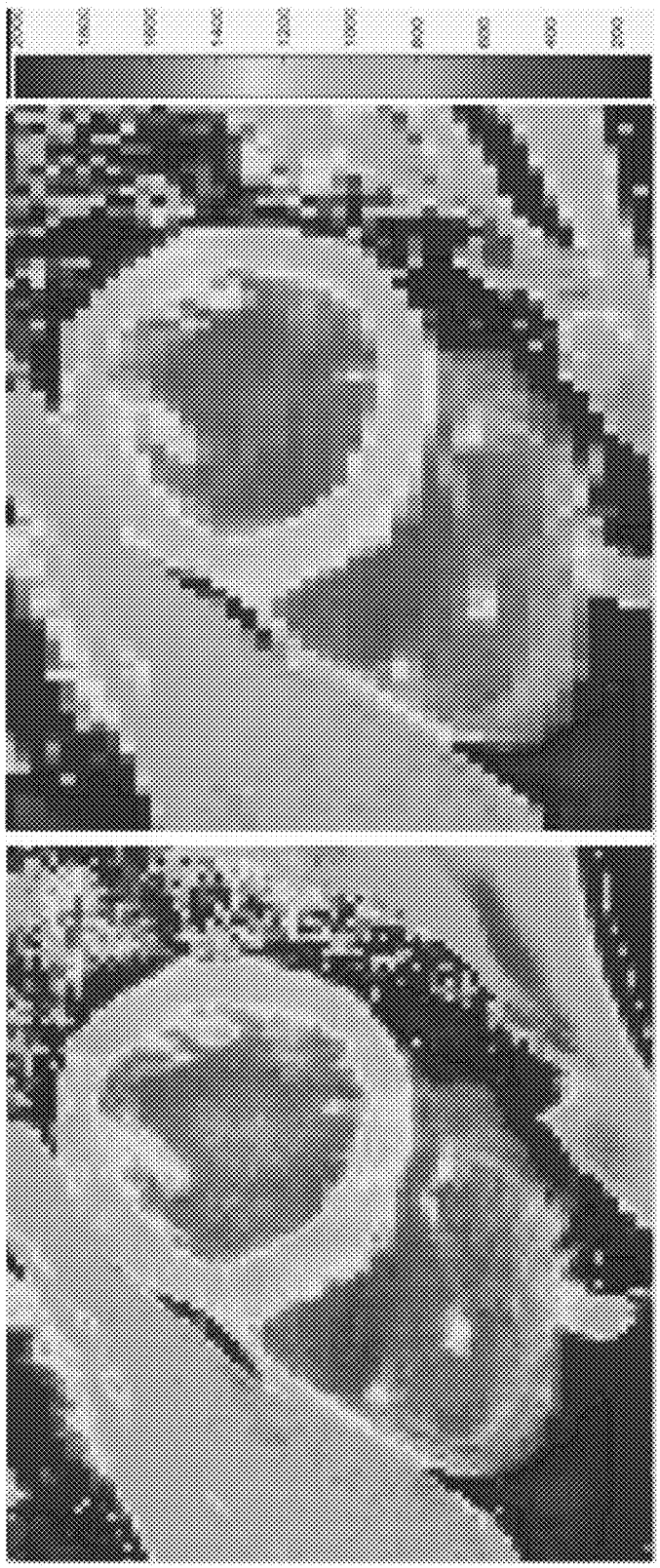
FIGS. 10A-10B are a comparison between a representative high resolution cardiac T1 map (MOLLI, 3-3-5, image size: 256×192) reconstructed with SENSE−SUPER (FIG. 10A) and a standard-resolution T1 map reconstructed with 2-fold SENSE (FIG. 10B).

FIGS. 10A-10B compare a representative high-resolution MOLLI T1 map (image size: 256×192) reconstructed by SENSE-SUPER, with a 4-fold undersampling of k-space, to a standard-resolution MOLLI T1 map (image size: 192× 144) reconstructed with 2-fold SENSE.

Cardiac T2 Mapping

Cardiac T2 mapping is usually performed with 3 T2-weighted bSSFP single-shot images acquired in 9 heartbeats, with 3 idle heartbeats between each two acquisitions (Giri, et al., J Cardiovasc. Magn. Reson. 2009; 11:56). Three TEs of 0, 25 ms, and 55 ms, are usually used. In this work, the original cardiac T2 mapping sequence was modified, aiming to acquire 4 single-shot images in 13 heartbeats, with TE of 0, 32 ms, 48 ms, and 64 ms, respectively, since a minimal acceleration of 2 requires at least 4 images. Like cardiac T1 mapping (MOLLI), SENSE and SUPER were first separately performed at a medium resolution (image size: 192×144, acceleration factor: 2) so that the resultant T2 maps from the two acceleration techniques can be compared. High resolution (image size: 256×192, acceleration factor: 4) cardiac T2 mapping was performed after that by using SENSE-SUPER.

Figure 12:
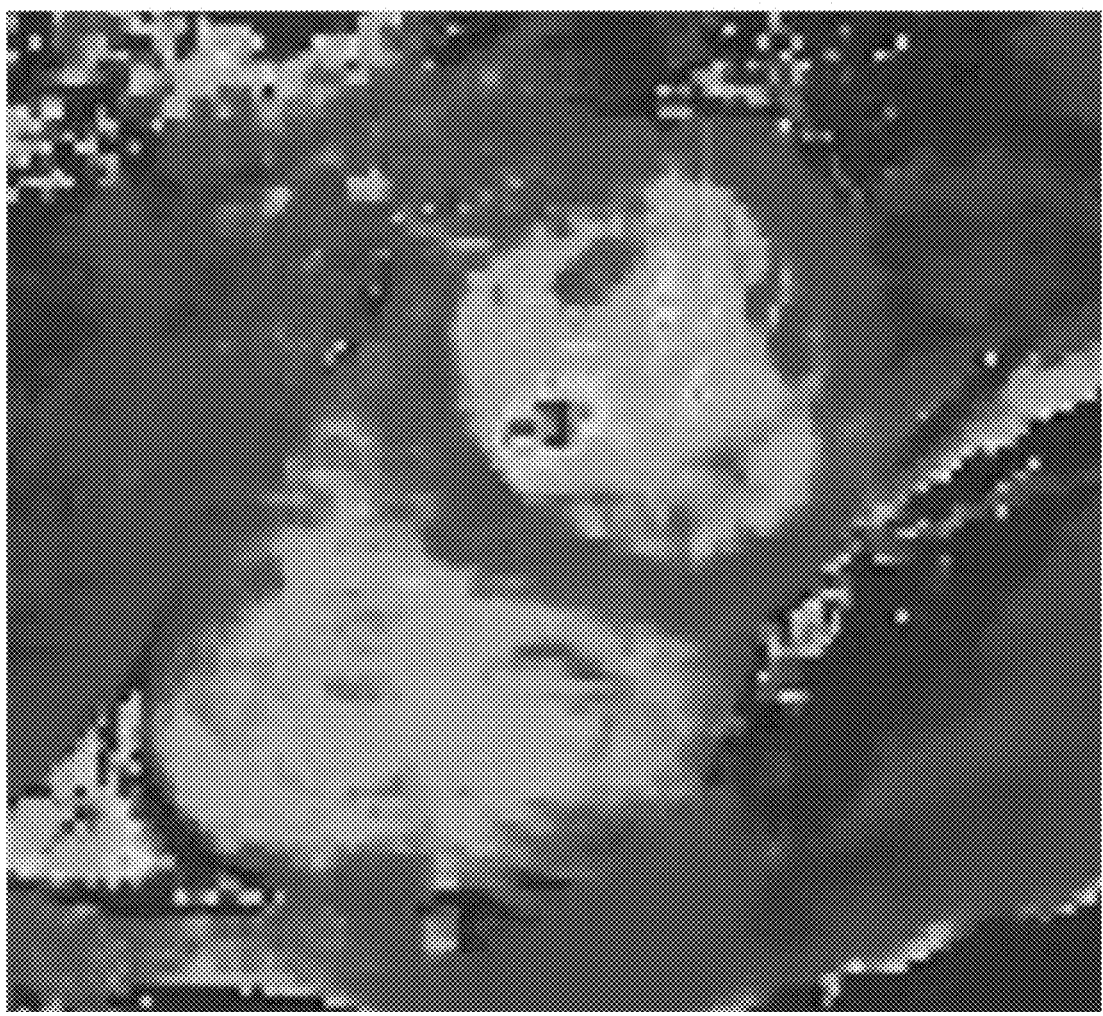
FIG. 12 is a representative high-resolution cardiac T2 map reconstructed with SENSE−SUPER with 4-fold acceleration.

FIGS. 11A-11B compare a representative T2 map reconstructed with SENSE to a representative T2 map reconstructed with SUPER, both using 2-fold acceleration. The images are highly similar to each other. FIG. 12 shows a representative high-resolution T2 map reconstructed with joint SENSE and SUPER. The quality is acceptable.

Brain T1 and T2 Mapping

SUPER was performed in brain T1 and T2 mapping to evaluate the feasibility of this application. T1 mapping was based on 8 inversion recovery turbo spin echo (IR TSE) images, acquired at TI of 250 ms, 500 ms, 750 ms, 1000 ms, 1500 ms, 2000 ms, 3500 ms, and 5000 ms. The subject was informed to keep as static as possible during the 6.4-minute scan. Other parameters of this sequence were: TR=5200 ms, ETL=16, FOV: 240 mm×240 mm, image size: 256×256, slice thickness: 5 mm, bandwidth: 130 Hz/Pixel, scan time for a single image: 48 ms. T2 mapping was based on 7 TSE images, acquired at TE of 17 ms, 29 ms, 41 ms, 53 ms, 65 ms, 77 ms, and 89 ms. All other parameters of T2 mapping were the same as the T1 mapping. A 12-channel head coil was used, with effectively 4 channels used in the reconstruction by employing the CP (circularly polarized) mode.

The acquired data was first processed by voxel-by-voxel curve fitting to yield a gold-standard T1 and T2 map. Then, 2-fold acceleration was achieved by using SENSE, and SUPER. Finally, 4-fold acceleration was achieved by using combined SENSE and SUPER.

Figure 13:
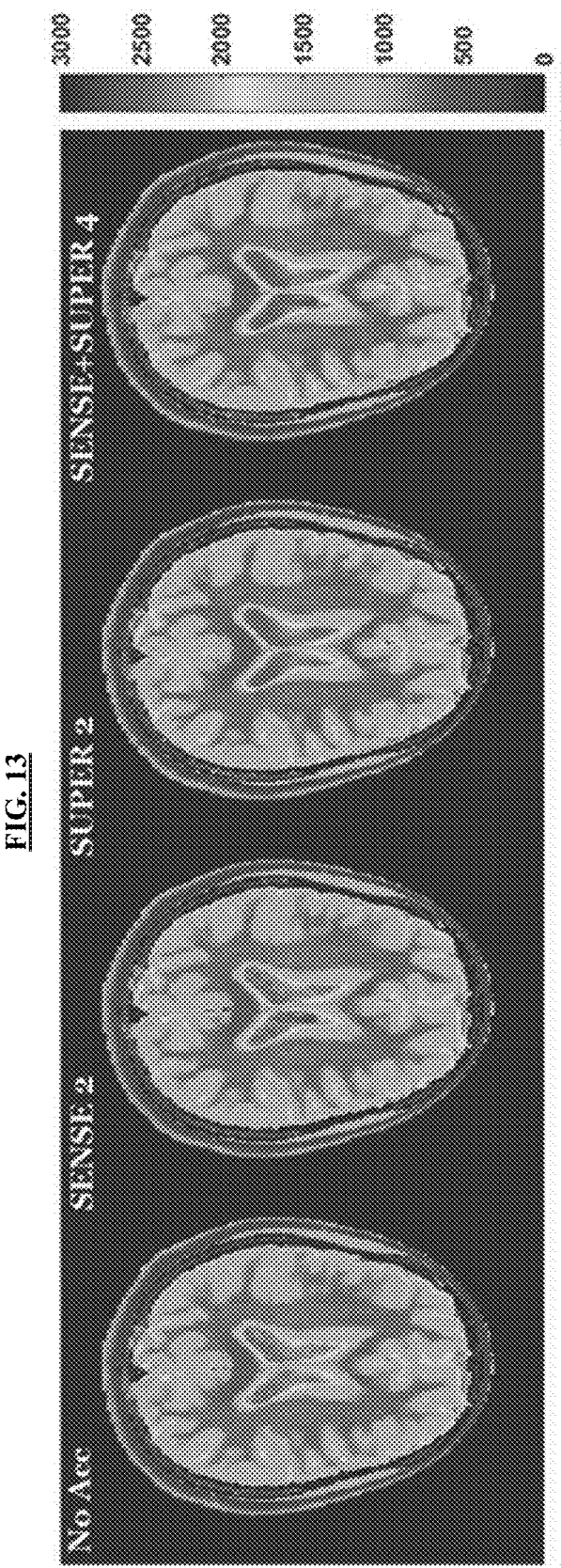
FIG. 13 is a series of images depicting (from left to right) brain T1 maps reconstructed without acceleration, with 2-fold acceleration based on SENSE, 2-fold acceleration based on SUPER, and 4-fold acceleration based on SENSE−SUPER.
Figure 14:
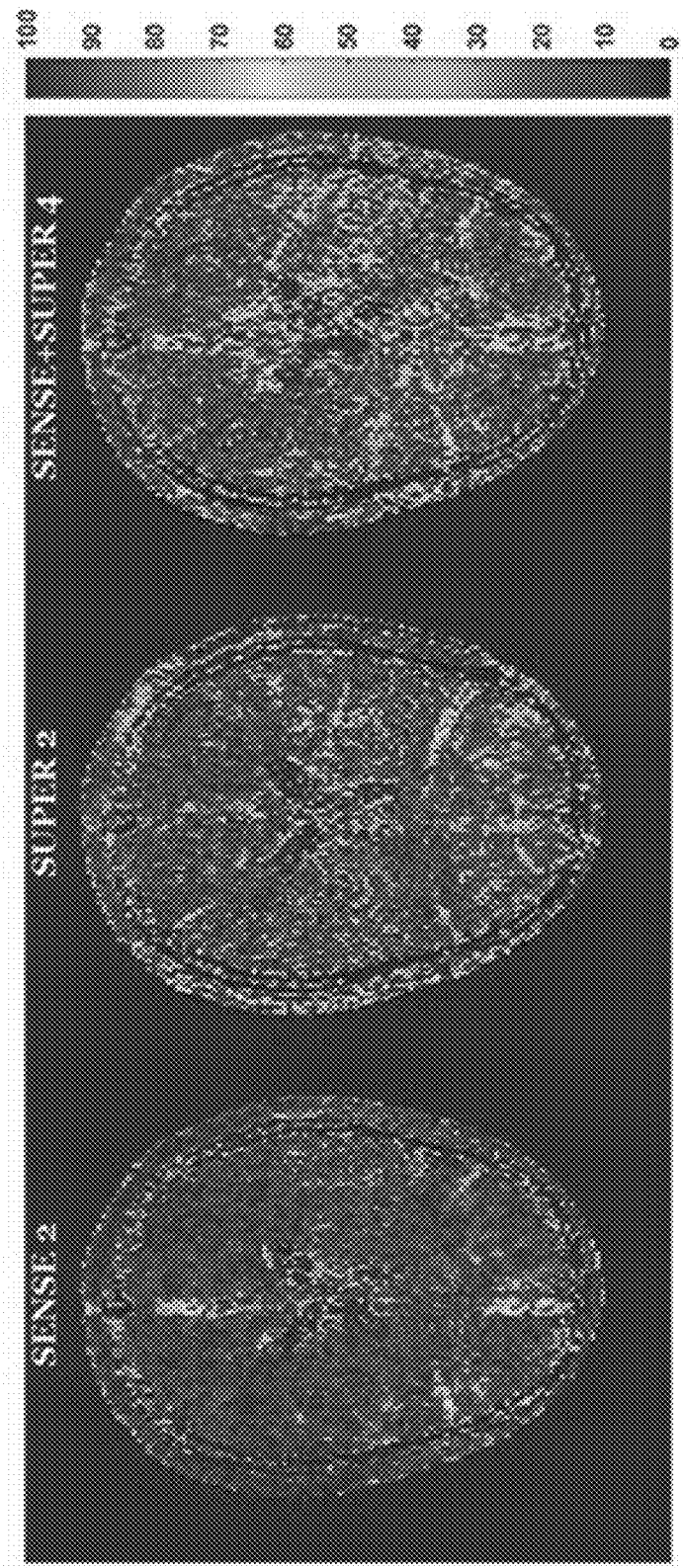
FIG. 14 is an image showing the difference between the acceleration-free brain T1 map and the three accelerated T1 maps: 2-fold SENSE (left), 2-fold SUPER (middle), and 4-fold SENSE−SUPER (right).

FIG. 13 shows representative brain T1 maps reconstructed without acceleration, with 2-fold SENSE, 2-fold SUPER, and 4-fold SENSE-SUPER. Visual inspection shows that the four images are very similar to each other. The difference images between the acceleration-free T1 map and the other three maps are shown in FIG. 14. Two-fold SUPER appears slightly noisier than 2-fold SENSE, and 4-fold SENSE-SUPER is most noisy. However, in most areas of the brain, the difference between SUPER and the gold standard is less than 10 ms. Subtle aliasing from subcutaneous fat is visible in all three maps.

Figure 15:
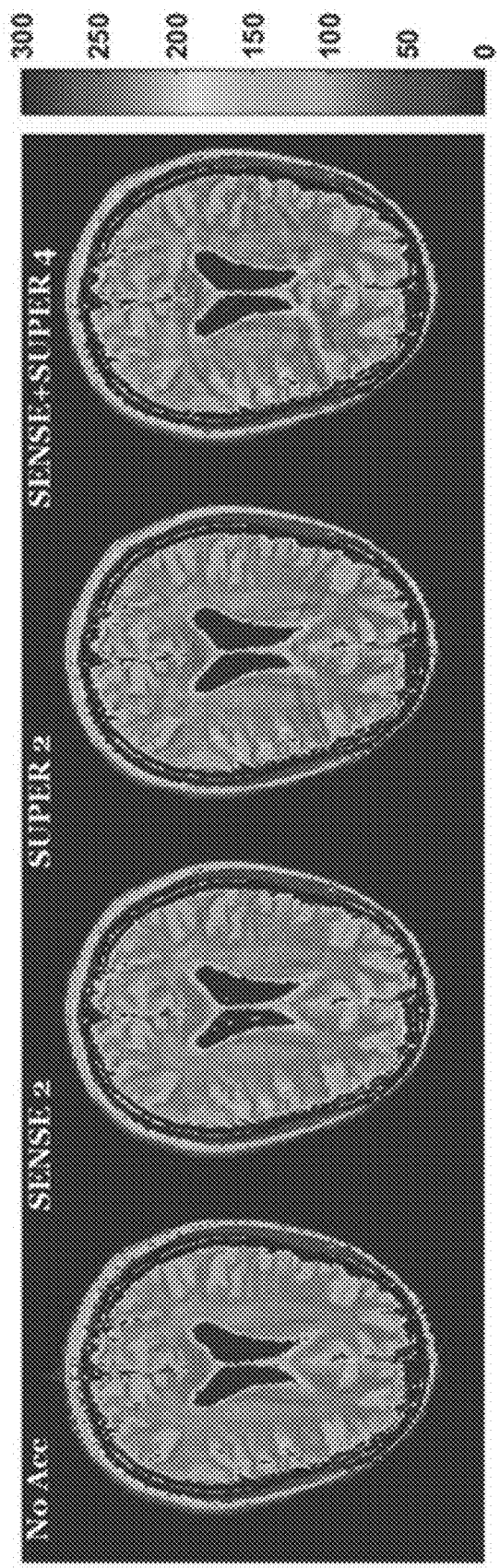
FIG. 15 is a series of images depicting (from left to right) brain T2 maps reconstructed without acceleration, with 2-fold acceleration based on SENSE, 2-fold acceleration based on SUPER, and 4-fold acceleration based on SENSE−SUPER.
Figure 16:
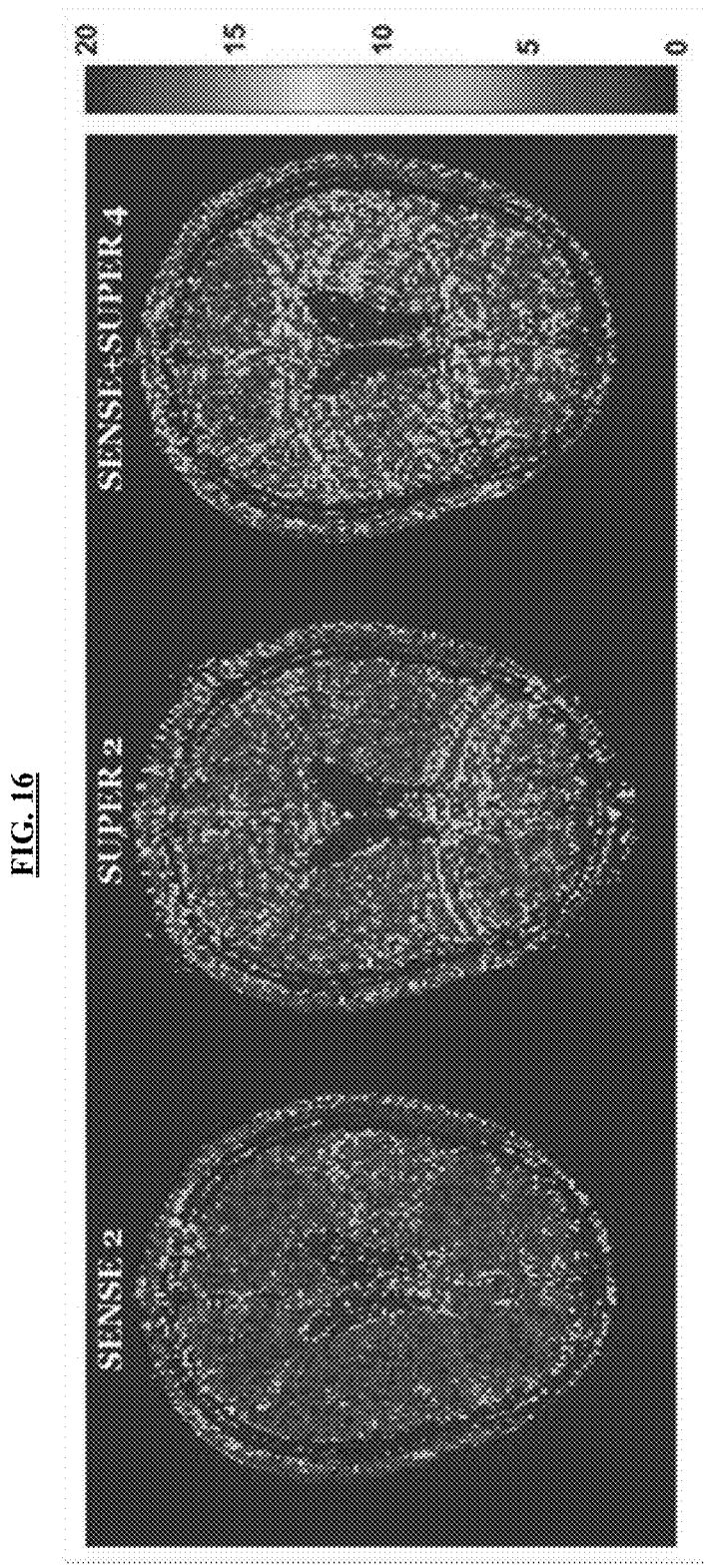
FIG. 16 is an image showing the difference between the acceleration-free brain T2 map and the three accelerated T2 maps: 2-fold SENSE (left), 2-fold SUPER (middle), and 4-fold SENSE−SUPER.

FIG. 15 shows representative brain T2 maps reconstructed with acceleration, with 2-fold SENSE, 2-fold SUPER, and 4-fold SENSE-SUPER. Overall, image quality is very similar among these T2 maps. The only artifacts are aliasing, mainly in the area that is half FOV away from the subcutaneous fat. This artifact becomes more severe when acceleration factor increases. This artifact is also clearly shown in the difference map, shown in FIG. 16. These artifacts can be easily removed by employing fat saturation.

Example 11: Optimized Brain Imaging Using the Methods of the Invention

Brain T1 mapping was performed on 5 healthy volunteers with a 3T scanner (Siemens Trio, Erlangen, Germany) and a 12-channel birdcage head coil. The T1 mapping was based on 8 continuously applied IR TSE sequences with TI values of 250 ms, 500 ms, 750 ms, 1000 ms, 1500 ms, 2000 ms, 3500 ms, and 5000 ms. Additional parameters included: TR=5200 ms, ETL=16, FOV: 240 mm×240 mm, acquisition matrix size: 256×128, reconstruction size: 512×256, slice thickness: 4 mm, bandwidth: 789 Hz/pixel. T1 mapping was performed using the 3-parameter model (A−B*exp(−t/T1)) with four sampling schemes: full-sampling, SENSE (R=2), SUPER (R=2), and the combination SENSE+SUPER (R=4). Coil mapping was performed using the image at TI=5000 ms with the method in McKenzie et al. *Magnetic resonance in medicine* 2002; 47(3):529-538. The non-accelerated T1 mapping result was used as a gold standard. White and gray matter ROIs were segmented based on the gold standard T1 map, of which voxels with T1 in [580 ms, 1080 ms] were classified as the white matter and voxels with T1 in [1080 ms, 1580 ms] were classified as the gray matter. Mean T1 in the gray and white matter ROIs were measured for each method.

Figure 17D:
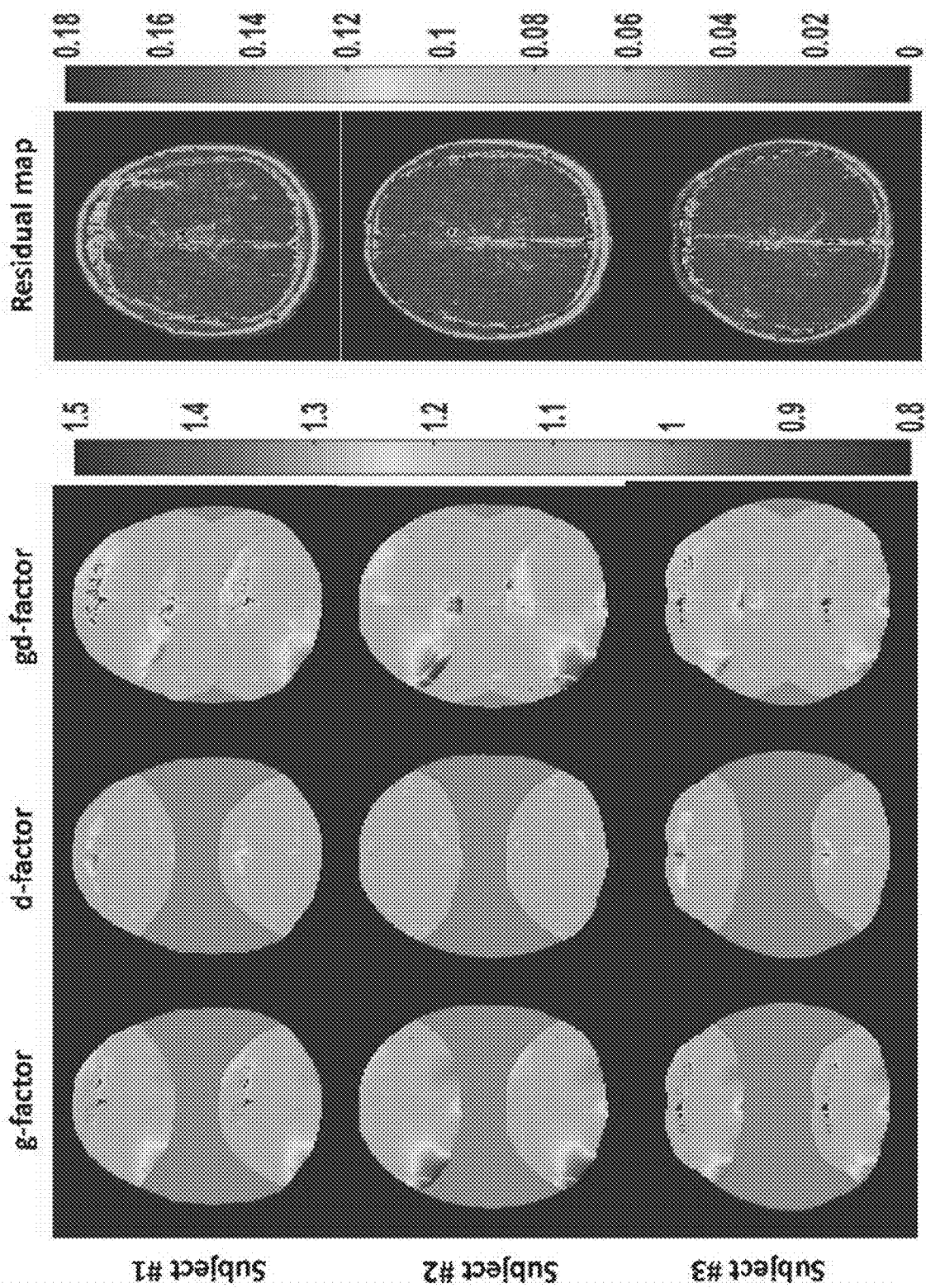
FIG. 17D is a set of noise amplification factor (NAF) maps for each accelerated T1 mapping and the normalized residual map for each subject shown in FIG. 17A.

FIGS. 17A-17D show three representative examples of brain T1 mapping. FIG. 17A shows the T1 maps reconstructed with non-acceleration (gold standard), SENSE (R=2), SUPER (R=2), and SENSE+SUPER (R=4) and an amplification of each T1 map(FIG. 17B). All 3 acceleration methods led to a visually similar T1 map compared to the gold standard. There was a clear noise amplification in the SENSE+SUPER T1 map in the amplified images, but not so in SENSE or SUPER T1 maps. This was also verified in the T1 difference maps shown in FIG. 17C. There was some aliasing artifacts from the edge of the brain, including fat and skull, in the SUPER result and SENSE+SUPER result. FIG. 17D shows the NAF map associated with each acceleration method and a residual map, which showed the normalized residual (residual divided by the $l_2$ norm of the signal) at each voxel from the non-accelerated T1 mapping. The d-factor map was more homogeneous than the g-factor map, and the gd-factor map showed the strongest noise amplification among the three. The residual map showed there was a relatively high residual in the edge of the brain (likely fat) and the cerebrospinal flow (CSF). These regions also matched the regions with a large difference in the T1-difference map.

Table 4 shows the ROI analysis results for the brain T1 mapping. The mean T1 value of the gray and white matter ROI over the various subjects was very similar between the non-accelerated approach and all 3 acceleration approaches. SENSE+SUPER appeared to have a slightly lower T1 than the gold standard, but the difference was very small (both less than 1% relative to the gold standard).

TABLE 4

Mean T1 of gray and white matter ROI measured by
different T1 mapping methods

| ROI | Gold Standard (R = 1) | SENSE (R = 2) | SUPER (R = 2) | SENSE + SUPER (R = 4) |
|---|---|---|---|---|
| Gray Matter | 1332 ms ± 4 ms | 1331 ms ± 3 ms (p = 0.20) | 1333 ms ± 3 ms (p = 0.42) | 1321 ms ± 6 ms (p = 0.008) |
| White Matter | 937 ms ± 16 ms | 938 ms ± 16 ms (p = 0.50) | 939 ms ± 17 ms (p = 0.19) | 933 ms ± 18 ms (p = 0.06) |

Example 12: Optimized Cardiac Imaging Using the Methods of the Invention

Cardiac T1 mapping was performed in 8 healthy volunteers with a 3T scanner (Siemens Trio, Erlangen, Germany), a 12-channel phased-array spine coil, and a 6-channel phased-array torso coil. A short-axis mid-ventricular view was chosen for imaging. A standard MOLLI cardiac T1 mapping sequence (3(3)3(3)5) was modified to enable SUPER and SENSE+SUPER. T1 mapping was performed with different accelerations and resolution, including a low-resolution MOLLI without any acceleration, a regular-resolution MOLLI with 2-fold SENSE, a regular-resolution MOLLI with 2-fold SUPER, and a high-resolution MOLLI with 4-fold SENSE+SUPER. All sequences were performed with a single breath-hold, 17 heartbeats, and initial TIs of 100 ms, 200 ms, and 350 ms. The sequence parameters for the low-resolution MOLLI T1 mapping was: FOV=360 mm×270 mm, acquisition matrix size: 160×84, slice thickness: 8 mm, balanced steady-state free precession (bSSFP) readout, bandwidth: 1495 Hz/pixel, TR=2.5 ms, and flip angle=40°. The regular-resolution MOLLI and the high-resolution MOLLI used the same parameters except image size=192×108 and 256×192, respectively. For all accelerated scans, the central 24 k-space lines were sampled for coil mapping (McKenzie et al. *Magnetic resonance in medicine* 2002; 47(3):529-538.). Image reconstruction was performed offline with Matlab (v2014b, Mathworks, Natick, Mass.). K-space data was first low-passed filtered with Fermi filter and zero-padded to double the image resolution in both directions. ROIs were drawn in the myocardium and blood pool to evaluate accuracy of each T1 mapping method.

Figure 18B:
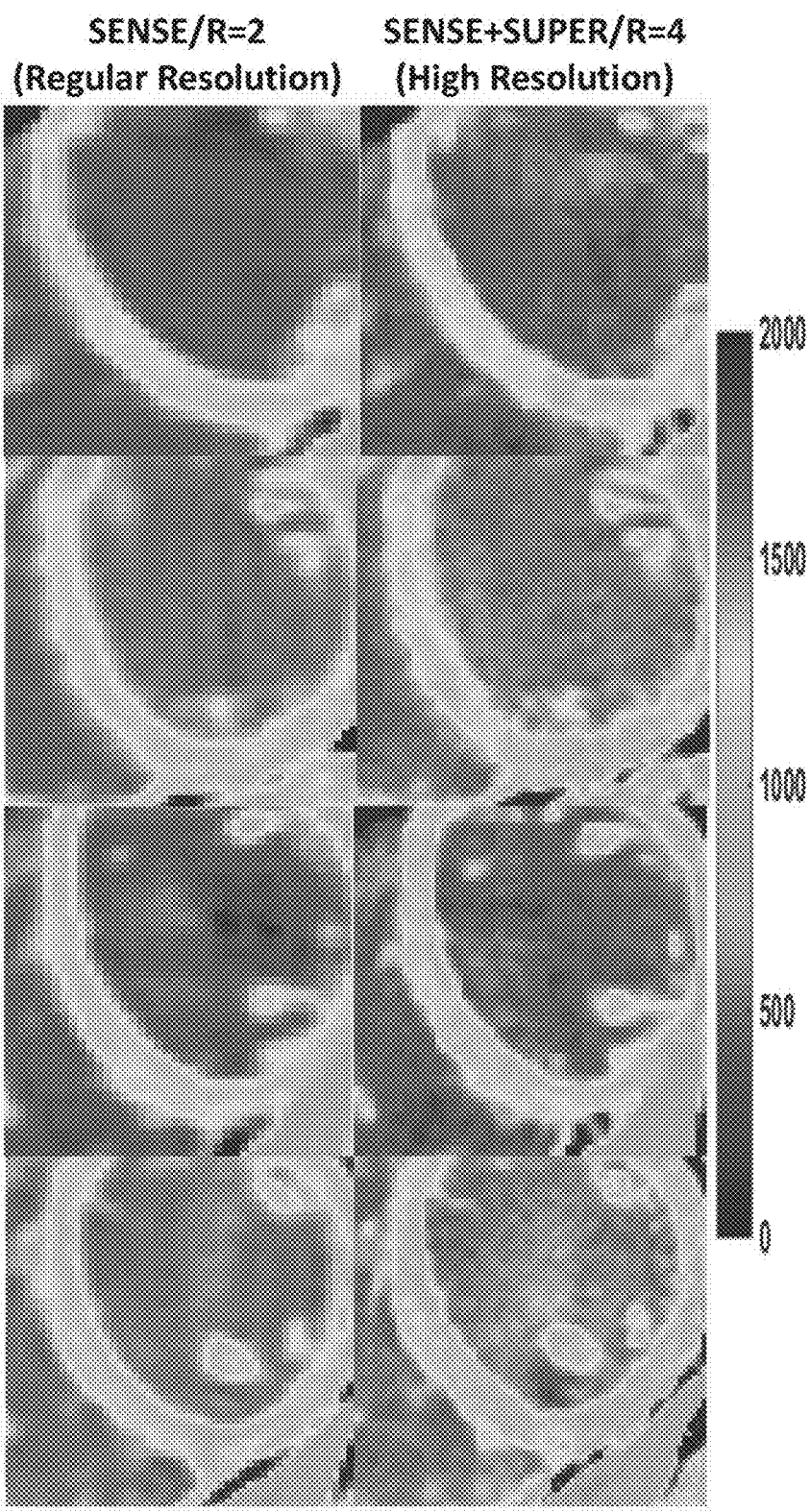
FIG. 18B is an amplification of the SENSE T1 map and SENSE+SUPER T1 map around the area of interventricular septum to emphasize the benefit of higher resolution in visualization of septal wall and papillary muscles.

FIGS. 18A-18B show 4 representative examples of cardiac T1 mapping. Both SUPER and SENSE+SUPER led to a similar image quality compared to SENSE. By amplifying the septal wall area in the SENSE and SENSE+SUPER T1 maps, the latter method resulted in an improved depiction of the septal walls, especially near the interface between myocardium and blood, and in the papillary muscles (arrow heads). There was a slight increase of map-noise in the high-resolution result, but its overall map-SNR was reasonable.

Table 5 shows the ROI analysis results for the cardiac T1 mapping. The mean T1 value of the myocardial and blood ROI over the subjects was similar between the non-accelerated approach and all 3 acceleration approaches. There was a significant but small difference between the gold standard and SUPER for the myocardial ROI (2% relative to the gold standard) and between the gold standard and SENSE+SUPER for the blood ROI (3% relative to the gold standard).

TABLE 5

Mean T1 of myocardial and blood ROI measured
by different T1 mapping methods

| ROI | Gold Standard (R = 1) Low-Resolution | SENSE (R = 2) Regular-Resolution | SUPER (R = 2) Regular-Resolution | SENSE + SUPER (R = 4) High-Resolution |
|---|---|---|---|---|
| Myocardium | 1142 ms ± 34 ms | 1149 ms ± 28 ms (p = 0.28) | 1167 ms ± 33 ms (p = 0.005) | 1149 ms ± 48 ms (p = 0.57) |
| Blood | 1699 ms ± 112 ms | 1681 ms ± 84 ms (p = 0.33) | 1704 ms ± 102 ms (p = 0.55) | 1644 ms ± 86 ms (p = 0.006) |

The disclosures of each and every patent, patent application, and publication cited herein are hereby incorporated herein by reference in their entirety. While this invention has been disclosed with reference to specific embodiments, it is apparent that other embodiments and variations of this invention may be devised by others skilled in the art without departing from the true spirit and scope of the invention. The appended claims are intended to be construed to include all such embodiments and equivalent variations.

What is claimed is:

1. A method of imaging an object comprising:
    acquiring magnetic resonance imaging (MRI) signal data for the object using Cartesian sampling with undersampling of k-space in the phase-encoding direction at each time point of the signal dynamics, such that the undersampling pattern shifts circularly in each time frame along the phase-encoding direction and the temporal signal at spatially equidistant voxels is modulated and combined into a single aliased signal; and
    reconstructing an image of the object using a physical model that dictates the signal dynamics, whereby at each query voxel an equation is solved to resolve each individual temporal signal within the single aliased signal, thus yielding one or more parameters of the physical model;

wherein k-space is undersampled by uniformly skipping a number of lines in the phase-encoding direction and the undersampling pattern circularly shifts in the phase-encoding direction at each subsequent time point of the signal dynamics and wherein the largest undersampling rate is restricted to the largest integer which is less than K/M; where K is the number of images and M is the number of parameters in the physical model.

2. The method of claim 1, wherein the one or more parameters are selected from the group consisting of T1 relaxation rate, T2 relaxation rate, proton density, T2* relaxation rate, B0 field strength, B1 field strength, blood flow, apparent diffusion coefficient, and diffusion tensor.

3. The method of claim 1, wherein the number of parameters per voxel is equal to the average number of k-space samples per voxel.

4. The method of claim 1, wherein the equation at each query voxel is solved by minimizing a least-squares cost function.

5. The method of claim 4, wherein the least-squares cost function is:

$$\left\| I_n(m, t_l) - \sum_{r=1-\lceil \frac{R}{2} \rceil}^{\lfloor \frac{R}{2} \rfloor} w_r(t_l) s_{n-r\frac{N}{R}}(m) f\left(\vec{x}_{n-r\frac{N}{R}}, t_l\right) \right\|^2$$

wherein:

$I_n(m,t_l)$ is the aliased signal at voxel n, coil index m, and the time point $t_l$;

$w_r(\bullet)$ is the modulation function for the aliasing signal at voxel $$n - r\frac{N}{R};$$

$$s_{n-r\frac{N}{R}}(m)$$

is the coil sensitivity of the mth coil at the aliasing voxel $$n - r\frac{N}{R};$$

$f(\bullet,t_l)$ is the underlying signal model;

$$\vec{x}_{n-r\frac{N}{R}}$$

is the unknown parameter at the aliasing voxel $$n - r\frac{N}{R};$$

R is the acceleration factor;

N is the total number of lines in the phase-encoding direction; and the symbols $\lfloor \bullet \rfloor$ and $\lceil \bullet \rceil$ represent the largest integer less than and the smallest integer greater than the argument, respectively.

6. The method of claim 5, wherein the $f(\bullet,t_l)$ and $$\vec{x}_{n-r\frac{N}{R}}$$

terms are substituted for a specific physical model.

7. The method of claim 6, wherein the $f(\bullet,t_l)$ and $$\vec{x}_{n-r\frac{N}{R}}$$

terms are replaced $$f(\cdot, t_l) = A - B\exp\left(-\frac{t_l}{T1}\right) \text{ and}$$

$$\vec{x}_{n-r\frac{N}{R}} = \left[A_{n-r\frac{N}{R}}, B_{n-r\frac{N}{R}}, T1_{n-r\frac{N}{R}}\right]^T$$

where $[\,\ldots\,]^T$ represents the vector transpose.

8. The method of claim 6, wherein the $f(\bullet,t_l)$ and $$\vec{x}_{n-r\frac{N}{R}}$$

terms are replaced by $$f(\cdot, t_l) = A\exp\left(-\frac{t_l}{T1}\right) \text{ and}$$

$$\vec{x}_{n-r\frac{N}{R}} = \left[A_{n-r\frac{N}{R}}, T2_{n-r\frac{N}{R}}\right]^T.$$

9. The method of claim 5, wherein the least-squares cost function is minimized by an unconstrained optimization algorithm or a dictionary-based exhaustive search algorithm.

10. The method of claim 9, wherein the minimization of the least-squares cost function is solved using an algorithm selected from the group consisting of steepest descend, conjugate gradients, Gauss-Newton and Levenberg-Marquardt.

11. The method of claim 10, wherein the minimization of the least-squares cost function is solved using an algorithm selected from the group consisting of Gauss-Newton and Levenberg-Marquardt.

12. The method of claim 1, wherein the imaging method is a medical imaging method.

13. The method of claim 12, wherein the medical imaging method is magnetic resonance imaging (MRI).

14. The method of claim 12, wherein the medical imaging method is adapted and configured to image one or more organs selected from the group consisting of the heart, liver, kidneys, abdomen, breast, prostate, brain, knee, and any muscularskeletal system.

15. The method of claim 12, wherein the medical imaging method is at least one selected from the group consisting of cardiac tissue characterization, detection of edema, detection of iron overload in the heart and liver, water-fat separation imaging, clinical neuralimaging, functional MRI, tumor imaging, flow mapping, mapping of apparent diffusion coefficient, diffusion tensor imaging, and magnetic resonance fingerprinting.

16. The method of claim 1, further comprising one or more additional imaging acceleration methods selected from the group consisting of SENSE (parallel imaging), partial Fourier techniques, and simultaneous multi-slice techniques.

17. The method of claim 1, wherein the noise amplification due to the acceleration is quantified by the dynamics-factor (d-factor) in the absence of parallel imaging, or the dynamics-geometry-factor (dg-factor) in the presence of parallel imaging.

18. The method of claim 1, wherein the method is adapted and configured for 2D parametric mapping applications.

19. The method of claim 1, wherein the method is adapted and configured for 3D parametric mapping applications.

\* \* \* \* \*